US008682585B1

(12) United States Patent
Hoff

(10) Patent No.: US 8,682,585 B1
(45) Date of Patent: Mar. 25, 2014

(54) COMPUTER-IMPLEMENTED SYSTEM AND METHOD FOR INFERRING OPERATIONAL SPECIFICATIONS OF A PHOTOVOLTAIC POWER GENERATION SYSTEM

(71) Applicant: Clean Power Research, L.L.C., Napa, CA (US)

(72) Inventor: Thomas E. Hoff, Napa, CA (US)

(73) Assignee: Clean Power Research, L.L.C., Napa, CA (US)

( * ) Notice: Subject to any disclaimer, the term of this patent is extended or adjusted under 35 U.S.C. 154(b) by 0 days.

(21) Appl. No.: 13/784,560

(22) Filed: Mar. 4, 2013

Related U.S. Application Data

(63) Continuation-in-part of application No. 13/462,505, filed on May 2, 2012, now Pat. No. 8,437,959, which is a continuation of application No. 13/453,956, filed on Apr. 23, 2012, now Pat. No. 8,335,649, which is a continuation of application No. 13/190,442, filed on Jul. 25, 2011, now Pat. No. 8,165,812.

(51) Int. Cl.
*G01F 19/00* (2006.01)
(52) U.S. Cl.
USPC .................................................... 702/3
(58) Field of Classification Search
USPC .................... 702/3, 187; 703/2, 13
See application file for complete search history.

(56) References Cited

U.S. PATENT DOCUMENTS

2007/0084502 A1* 4/2007 Kelly et al. .................. 136/246
2011/0137591 A1   6/2011 Ishibashi

OTHER PUBLICATIONS

Brinkman et al., "Toward a Solar-Powered Grid." IEEE Power & Energy, vol. 9, No. 3, May/Jun. 2011.
California ISO. Summary of Preliminary Results of 33% Renewable Integration Study—2010 CPUC LTPP. May 10, 2011.
Ellis et al., "Model Makers." IEEE Power & Energy, vol. 9, No. 3, May/Jun. 2011.
Danny at al., "Analysis of solar heat gain factors using sky clearness index and energy implications." Energy Conversions and Management, Aug. 2000.
Hoff et al., "Quantifying PV Power Output Variability." Solar Energy 84 (2010) 1782-1793, Oct. 2010.
Hoff et al., "PV Power Output Variability: Calculation of Correlation Coefficients Using Satellite Insolation Data." American Solar Energy Society Annual Conference Proceedings, Raleigh, NC, May 18, 2011.
Kuszamaul et al., "Lanai High-Density Irradiance Sensor Network for Characterizing Solar Resource Variability of MW-Scale PV System." 35th Photovoltaic Specialists Conference, Honolulu, HI. Jun. 20-25, 2010.

(Continued)

*Primary Examiner* — Sujoy Kundu
(74) *Attorney, Agent, or Firm* — Patrick J. S. Inouye

(57) ABSTRACT

A computer-implemented system and method for inferring operational specifications of a photovoltaic power generation system is provided. The operational specifications of a photovoltaic plant configuration can be inferred through evaluation of historical measured system production data and measured solar resource data. Preferably, the solar resource data includes both historical and forecast irradiance values. Based upon the location of the photovoltaic plant, a time-series power generation data set is simulated based on a normalized and preferably substantially linearly-scalable solar power simulation model. The simulation is run for a range of hypothetical photovoltaic system configurations. A power rating is derived for each system configuration by comparison of the measured versus simulated production data, which is applied to scale up the simulated time-series data. The simulated energy production is statistically compared to actual historical data, and the system configuration reflecting the lowest overall error is identified as the inferred (and optimal) system configuration.

21 Claims, 29 Drawing Sheets

(56) References Cited

OTHER PUBLICATIONS

Serban C., "Estimating CLear SKy Solar Global Radiation Using Clearness Index, for Brasov Urban Area".

Mills et al., "Dark Shadows." IEEE Power & Energy, vol. 9, No. 3, May/Jun. 2011.

Mills et al., "Implications of Wide-Area Geographic Diversity for Short-Term Variability of Solar Power." Lawrence Berkeley National Laboratory Technical Report LBNL-3884E.

Perez et al., "Parameterization of site-specific short-term irradiance variability." Solar Energy, 85 (2011) 1343-1345, Nov. 2010.

Perez et al., "Short-term irradiance variability correlation as a function of distance." Solar Energy, Mar. 2011.

Philip, J. "The Probability Distribution of the Distance Between Two Random Points in a Box." www.math.kth.se/~johanph/habc.pdf. Dec. 2007.

Stein, J., "Simulation of 1-Minute Power Output from Utility-Scale Photovoltaic Generation Systems." American Solar Energy Society Annual Conference Proceedings, Raleigh, NC, May 18, 2011.

Solar Anywhere, 2011. Web-Based Service that Provides Hourly, Satellite-Derived Solar Irradiance Data Forecasted 7 days Ahead and Archival Data back to Jan. 1, 1998. www.SolarAnywhere.com.

Stokes et al., "The atmospheric radiation measurement (ARM) program: programmatic background and design of the cloud and radiation test bed." Bulletin of American Meteorological Society vol. 75, No. 7, pp. 1201-1221, Jul. 1994.

Hoff et al., "Modeling PV Fleet Output Variability," Solar Energy, May 2010.

Olopade at al., "Solar Radiation Characteristics and the performance of Photovoltaic (PV) Modules in a Tropical Station." Journal Sci. Res. Dev. vol. 11, 100-109, 2008/2009.

Li et al. "Analysis of solar heat gain factors using sky clearness index and energy implications." 2000.

\* cited by examiner

Combine with Fleet Configuration

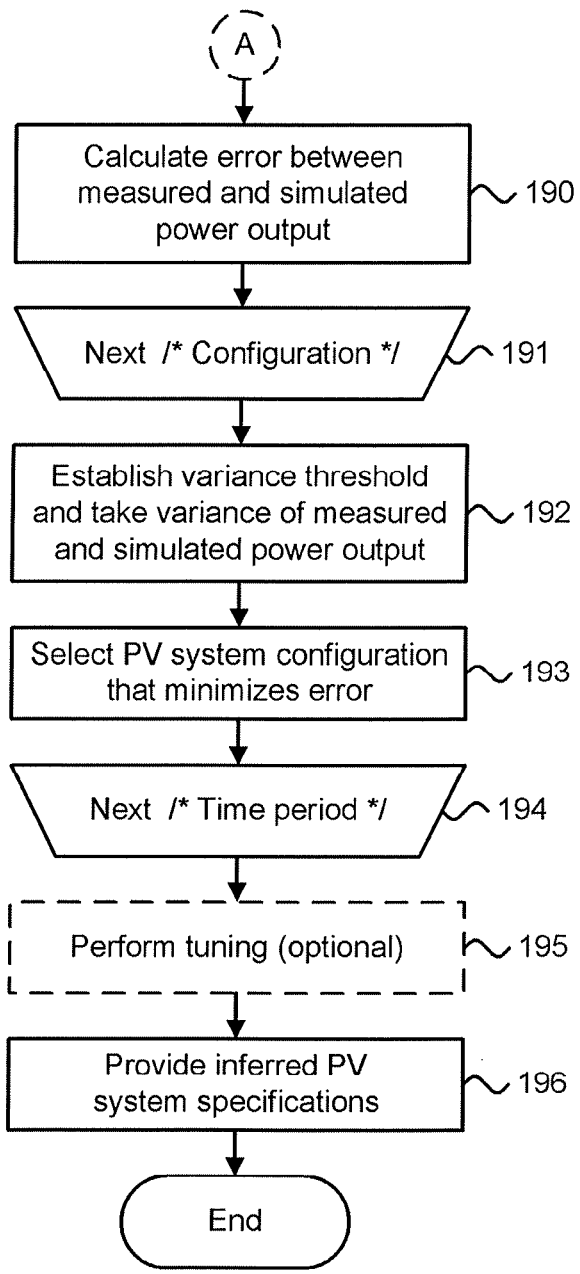
Fig. 19 (con'd).

Fig. 21.

| Type | Fixed | Fixed | Fixed | Fixed | Fixed | Fixed | Fixed | Fixed | Fixed | 1-Axis | 1-Axis | 1-Axis | 1-Axis |
|---|---|---|---|---|---|---|---|---|---|---|---|---|---|
| Azimuth | 180 | 180 | 180 | 180 | 180 | 180 | 180 | 180 | 180 | 180 | 180 | 180 | 180 |
| Tilt | 0 | 5 | 10 | 15 | 20 | 25 | 30 | 35 | 0 | 5 | 10 | 15 |
| 1/1/2012 6:00 | 0.00 | 0.00 | 0.00 | 0.00 | 0.00 | 0.00 | 0.00 | 0.00 | 0.00 | 0.00 | 0.00 | 0.00 |
| 1/1/2012 6:30 | 0.00 | 0.00 | 0.00 | 0.00 | 0.00 | 0.00 | 0.00 | 0.00 | 0.00 | 0.00 | 0.00 | 0.00 |
| 1/1/2012 7:00 | 0.00 | 0.00 | 0.00 | 0.00 | 0.00 | 0.00 | 0.00 | 0.00 | 0.00 | 0.00 | 0.00 | 0.00 |
| 1/1/2012 7:30 | 0.00 | 0.00 | 0.00 | 0.00 | 0.00 | 0.00 | 0.00 | 0.00 | 0.00 | 0.00 | 0.00 | 0.00 |
| 1/1/2012 8:00 | 0.08 | 0.10 | 0.12 | 0.14 | 0.15 | 0.17 | 0.18 | 0.19 | 0.31 | 0.31 | 0.32 | 0.32 |
| 1/1/2012 8:30 | 0.18 | 0.22 | 0.25 | 0.28 | 0.31 | 0.34 | 0.37 | 0.39 | 0.53 | 0.54 | 0.55 | 0.56 |
| 1/1/2012 9:00 | 0.27 | 0.32 | 0.36 | 0.40 | 0.44 | 0.48 | 0.51 | 0.54 | 0.60 | 0.62 | 0.64 | 0.66 |
| 1/1/2012 9:30 | 0.36 | 0.41 | 0.46 | 0.51 | 0.56 | 0.60 | 0.63 | 0.66 | 0.63 | 0.66 | 0.69 | 0.72 |
| 1/1/2012 10:00 | 0.40 | 0.45 | 0.50 | 0.54 | 0.58 | 0.62 | 0.65 | 0.68 | 0.57 | 0.60 | 0.63 | 0.67 |
| 1/1/2012 10:30 | 0.49 | 0.56 | 0.62 | 0.68 | 0.73 | 0.77 | 0.81 | 0.84 | 0.63 | 0.67 | 0.72 | 0.77 |
| 1/1/2012 11:00 | 0.50 | 0.57 | 0.63 | 0.68 | 0.73 | 0.77 | 0.81 | 0.84 | 0.57 | 0.62 | 0.67 | 0.72 |
| 1/1/2012 11:30 | 0.54 | 0.60 | 0.67 | 0.72 | 0.77 | 0.81 | 0.85 | 0.88 | 0.56 | 0.62 | 0.68 | 0.73 |
| 1/1/2012 12:00 | 0.57 | 0.64 | 0.70 | 0.76 | 0.81 | 0.85 | 0.89 | 0.93 | 0.57 | 0.64 | 0.70 | 0.76 |
| ... | ... | ... | ... | ... | ... | ... | ... | ... | ... | ... | ... | ... |

US 8,682,585 B1

COMPUTER-IMPLEMENTED SYSTEM AND METHOD FOR INFERRING OPERATIONAL SPECIFICATIONS OF A PHOTOVOLTAIC POWER GENERATION SYSTEM

CROSS-REFERENCE TO RELATED APPLICATION

This patent application is a continuation-in-part of U.S. patent application Ser. No. 13/462,505, filed May 2, 2012, pending; which is a continuation of U.S. Pat. No. 8,335,649, issued Dec. 18, 2012, pending; which is a continuation of U.S. Pat. No. 8,165,812, issued Apr. 24, 2012, the priority dates of which are claimed and the disclosures of which are incorporated by reference.

This invention was made with State of California support under Agreement Number 722. The California Public Utilities Commission of the State of California has certain rights to this invention.

FIELD

This application relates in general to photovoltaic power generation fleet planning and operation and, in particular, to a computer-implemented system and method for inferring operational specifications of a photovoltaic power generation system.

BACKGROUND

The manufacture and usage of photovoltaic systems has advanced significantly in recent years due to a continually growing demand for renewable energy resources. The cost per watt of electricity generated by photovoltaic systems has decreased dramatically, especially when combined with government incentives offered to encourage photovoltaic power generation. Photovoltaic systems are widely applicable as standalone off-grid power systems, sources of supplemental electricity, such as for use in a building or house, and as power grid-connected systems. Typically, when integrated into a power grid, photovoltaic systems are collectively operated as a fleet, although the individual systems in the fleet may be deployed at different physical locations within a geographic region.

Grid connection of photovoltaic power generation fleets is a fairly recent development. In the United States, the Energy Policy Act of 1992 deregulated power utilities and mandated the opening of access to power grids to outsiders, including independent power providers, electricity retailers, integrated energy companies, and Independent System Operators (ISOs) and Regional Transmission Organizations (RTOs). A power grid is an electricity generation, transmission, and distribution infrastructure that delivers electricity from supplies to consumers. As electricity is consumed almost immediately upon production, power generation and consumption must be balanced across the entire power grid. A large power failure in one part of the grid could cause electrical current to reroute from remaining power generators over transmission lines of insufficient capacity, which creates the possibility of cascading failures and widespread power outages.

As a result, planners and operators of power grids need to be able to accurately gauge both on-going and forecasted power generation and consumption. Photovoltaic fleets participating as part of a power grid are expected to exhibit predictable power generation behaviors. Power production data is needed at all levels of a power grid to which a photovoltaic fleet is connected. Accurate power production data is particularly crucial when a photovoltaic fleet makes a significant contribution to a power grid's overall energy mix. At the individual photovoltaic plant level, power production forecasting first involves obtaining a prediction of solar irradiance, which can be derived from ground-based measurements, satellite imagery, numerical weather prediction models, or other sources. The predicted solar irradiance data and each photovoltaic plant's system configuration is then combined with a photovoltaic simulation model, which generates a forecast of individual plant power output production. The individual photovoltaic plant forecasts can then be combined into a photovoltaic power generation fleet forecast, such as described in commonly-assigned U.S. Pat. Nos. 8,165,811; 8,165,812; 8,165,813, all issued to Hoff on Apr. 24, 2012; 8,326,535; 8,326,536, issued to Hoff on Dec. 4, 2012; and 8,335,649, issued to Hoff on Dec. 18, 2012, the disclosures of which are incorporated by reference.

A grid-connected photovoltaic fleet can be operationally dispersed over a neighborhood, utility region, or several states, and its constituent photovoltaic systems (or plants) may be concentrated together or spread out. Regardless, the aggregate grid power contribution of a photovoltaic fleet is determined as a function of the individual power contributions of its constituent photovoltaic plants, which, in turn, may have different system configurations and power capacities. Photovoltaic system configurations are critical to forecasting plant power output. Inaccuracies in the assumed specifications of photovoltaic system configurations directly translate to inaccuracies in their power output forecasts. Individual photovoltaic system configurations may vary based on power rating and electrical characteristics and by their operational features, such as tracking mode (fixed, single-axis tracking, dual-axis tracking), azimuth angle, tilt angle, row-to-row spacing, tracking rotation limit, and shading or other physical obstructions.

Photovoltaic system power output is particularly sensitive to shading due to cloud cover, and a photovoltaic array with only a small portion covered in shade can suffer a dramatic decrease in power output. For a single photovoltaic system, power capacity is measured by the maximum power output determined under standard test conditions and is expressed in units of Watt peak (Wp). However, at any given time, the actual power could vary from the rated system power capacity depending upon geographic location, time of day, weather conditions, and other factors. Moreover, photovoltaic fleets with individual systems scattered over a large geographical area are subject to different location-specific cloud conditions with a consequential affect on aggregate power output.

Consequently, photovoltaic fleets operating under cloudy conditions can exhibit variable and unpredictable performance. Conventionally, fleet variability is determined by collecting and feeding direct power measurements from individual photovoltaic systems or equivalent indirectly derived power measurements into a centralized control computer or similar arrangement. To be of optimal usefulness, the direct power measurement data must be collected in near real time at fine grained time intervals to enable a high resolution time series of power output to be created. However, the practicality of such an approach diminishes as the number of systems, variations in system configurations, and geographic dispersion of the photovoltaic fleet grow. Moreover, the costs and feasibility of providing remote power measurement data can make high speed data collection and analysis insurmountable due to the bandwidth needed to transmit and the storage space needed to contain collected measurements, and the processing resources needed to scale quantitative power measurement analysis upwards as the fleet size grows.

For instance, one direct approach to obtaining high speed time series power production data from a fleet of existing photovoltaic systems is to install physical meters on every photovoltaic system, record the electrical power output at a desired time interval, such as every 10 seconds, and sum the recorded output across all photovoltaic systems in the fleet at each time interval. The totalized power data from the photovoltaic fleet could then be used to calculate the time-averaged fleet power, variance of fleet power, and similar values for the rate of change of fleet power. An equivalent direct approach to obtaining high speed time series power production data for a future photovoltaic fleet or an existing photovoltaic fleet with incomplete metering and telemetry is to collect solar irradiance data from a dense network of weather monitoring stations covering all anticipated locations of interest at the desired time interval, use a photovoltaic performance model to simulate the high speed time series output data for each photovoltaic system individually, and then sum the results at each time interval.

With either direct approach to obtaining high speed time series power production data, several difficulties arise. First, in terms of physical plant, calibrating, installing, operating, and maintaining meters and weather stations is expensive and detracts from cost savings otherwise afforded through a renewable energy source. Similarly, collecting, validating, transmitting, and storing high speed data for every photovoltaic system or location requires collateral data communications and processing infrastructure, again at possibly significant expense. Moreover, data loss occurs whenever instrumentation or data communications do not operate reliably.

Second, in terms of inherent limitations, both direct approaches to obtaining high speed time series power production data only work for times, locations, and photovoltaic system configurations when and where meters are pre-installed; thus, high speed time series power production data is unavailable for all other locations, time periods, and photovoltaic system configurations. Both direct approaches also cannot be used to directly forecast future photovoltaic system performance since meters must be physically present at the time and location of interest. Fundamentally, data also must be recorded at the time resolution that corresponds to the desired output time resolution. While low time-resolution results can be calculated from high resolution data, the opposite calculation is not possible. For example, photovoltaic fleet behavior with a 10-second resolution can not be determined from data collected by existing utility meters that collect the data with a 15-minute resolution.

The few solar data networks that exist in the United States, such as the ARM network, described in G. M. Stokes et al., "The atmospheric radiation measurement (ARM) program: programmatic background and design of the cloud and radiation test bed," Bulletin of Am. Meteor. Soc., Vol. 75, pp. 1201-1221 (1994), the disclosure of which is incorporated by reference, and the SURFRAD network, do not have high density networks (the closest pair of stations in the ARM network are 50 km apart) nor have they been collecting data at a fast rate (the fastest rate is 20 seconds in the ARM network and one minute in the SURFRAD network). The limitations of the direct measurement approaches have prompted researchers to evaluate other alternatives. Researchers have installed dense networks of solar monitoring devices in a few limited locations, such as described in S. Kuszamaul et al., "Lanai High-Density Irradiance Sensor Network for Characterizing Solar Resource Variability of MW-Scale PV System."35th Photovoltaic Specialists Conf, Honolulu, Hi. (Jun. 20-25, 2010), and R. George, "Estimating Ramp Rates for Large PV Systems Using a Dense Array of Measured Solar Radiation Data," Am. Solar Energy Society Annual Conf. Procs., Raleigh, N.C. (May 18, 2011), the disclosures of which are incorporated by reference. As data are being collected, the researchers examine the data to determine if there are underlying models that can translate results from these devices to photovoltaic fleet production at a much broader area, yet fail to provide translation of the data. In addition, half-hour or hourly satellite irradiance data for specific locations and time periods of interest have been combined with randomly selected high speed data from a limited number of ground-based weather stations, such as described in CAISO 2011. "Summary of Preliminary Results of 33% Renewable Integration Study—2010," Cal. Public Util. Comm. LTPP No. R.10-05-006 (Apr. 29, 2011) and J. Stein, "Simulation of 1-Minute Power Output from Utility-Scale Photovoltaic Generation Systems," Am. Solar Energy Society Annual Conf. Procs., Raleigh, N.C. (May 18, 2011), the disclosures of which are incorporated by reference. This approach, however, does not produce time synchronized photovoltaic fleet variability for any particular time period because the locations of the ground-based weather stations differ from the actual locations of the fleet. While such results may be useful as input data to photovoltaic simulation models for purpose of performing high penetration photovoltaic studies, they are not designed to produce data that could be used in grid operational tools.

Similarly, accurate photovoltaic system configuration data is as important to photovoltaic power output forecasting as obtaining a reliable solar irradiance forecast. The specification of a photovoltaic system's configuration are typically provided by the owner or operator and can vary in terms of completeness, quality and correctness, which can complicate or skew power output forecasting. Moreover, in some situations, photovoltaic system configuration specifications may simply not be available, as can happen with privately-owned photovoltaic systems. Residential systems, for example, are typically not controlled or accessible by the grid operators and power utility and other personnel who need to fully understand and gauge their expected photovoltaic power output capabilities and shortcomings. Even large utility-connected systems may have specifications that are not publicly available due to privacy or security reasons.

Therefore, a need remains for an approach to determining photovoltaic system configuration specifications, even when configuration data is incomplete or unavailable, for use in forecasting power output.

SUMMARY

The operational specifications of a photovoltaic plant configuration can be inferred through evaluation of historical measured system production data and measured solar resource data. Preferably, the solar resource data includes both historical and forecast irradiance values. Based upon the location of the photovoltaic plant under consideration, a time-series power generation data set is simulated based on a normalized and preferably linearly-scalable solar power simulation model. The simulation is run for a wide range of hypothetical photovoltaic system configurations. A power rating is derived for each system configuration by comparison of the measured versus simulated production data, which is applied to scale up the simulated time-series data. The simulated energy production is statistically compared to actual historical data, and the system configuration reflecting the lowest overall error is identified as the inferred (and "optimal") system configuration.

One embodiment provides a computer-implemented system and method for inferring operational specifications of a photovoltaic power generation system. Historical power production data measured over an earlier time period for a location of a photovoltaic power generation plant are obtained. Historical measured irradiance data over the earlier time period is also obtained. A plurality of photovoltaic plant configurations that each include a power rating and operational features hypothesized for the plant are defined. Power output production data for each of the photovoltaic plant configurations is simulated based on a normalized photovoltaic power generation plant using the historical measured irradiance data for the earlier time period. A simulated photovoltaic system rating is derived as a function of the historical power production data and the simulated power output production data. The simulated power output production data is scaled by the simulated photovoltaic system rating over each point in the earlier time period. The plant's configuration is inferred from the photovoltaic plant configuration that exhibits a minimal error between the scaled simulated power output production data and the historical power production data.

Some of the notable elements of this methodology non-exclusively include:

(1) Employing a fully derived statistical approach to generating high-speed photovoltaic fleet production data;

(2) Using a small sample of input data sources as diverse as ground-based weather stations, existing photovoltaic systems, or solar data calculated from satellite images;

(3) Producing results that are usable for any photovoltaic fleet configuration;

(4) Supporting any time resolution, even those time resolutions faster than the input data collection rate;

(5) Providing results in a form that is useful and usable by electric power grid planning and operation tools; and (6) Inferring photovoltaic plant configuration specifications, which can be used to correct, replace or, if configuration data is unavailable, stand-in for the plant's specifications.

Still other embodiments will become readily apparent to those skilled in the art from the following detailed description, wherein are described embodiments by way of illustrating the best mode contemplated. As will be realized, other and different embodiments are possible and the embodiments' several details are capable of modifications in various obvious respects, all without departing from their spirit and the scope. Accordingly, the drawings and detailed description are to be regarded as illustrative in nature and not as restrictive.

BRIEF DESCRIPTION OF THE DRAWINGS

FIG. 21 is a table showing, by way of example, simulated half-hour photovoltaic energy production for a 1 kW-AC photovoltaic system.

DETAILED DESCRIPTION

Photovoltaic cells employ semiconductors exhibiting a photovoltaic effect to generate direct current electricity through conversion of solar irradiance. Within each photovoltaic cell, light photons excite electrons in the semiconductors to create a higher state of energy, which acts as a charge carrier for the electrical current. The direct current electricity is converted by power inverters into alternating current electricity, which is then output for use in a power grid or other destination consumer. A photovoltaic system uses one or more photovoltaic panels that are linked into an array to convert sunlight into electricity. A single photovoltaic plant can include one or more of these photovoltaic arrays. In turn, a collection of photovoltaic plants can be collectively operated as a photovoltaic fleet that is integrated into a power grid, although the constituent photovoltaic plants within the fleet may actually be deployed at different physical locations spread out over a geographic region.

Figure 1:
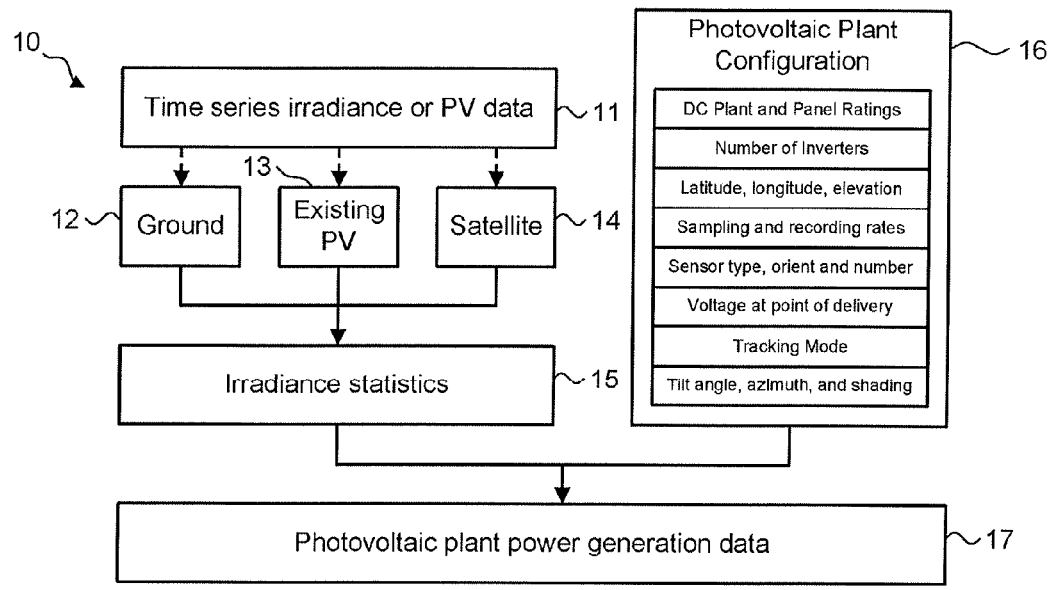
FIG. 1 is a flow diagram showing a computer-implemented method for generating a probabilistic forecast of photovoltaic fleet power generation in accordance with one embodiment.

To aid with the planning and operation of photovoltaic fleets, whether at the power grid, supplemental, or standalone power generation levels, accurate photovoltaic system configuration specifications are needed to efficiently estimate individual photovoltaic power plant production. Photovoltaic system configurations can be inferred, even in the absence of presumed configuration specifications, by evaluation of measured historical photovoltaic system production data and measured historical resource data. FIG. 1 is a flow diagram showing a computer-implemented method 10 for generating a probabilistic forecast of photovoltaic fleet power generation in accordance with one embodiment. The method 10 can be implemented in software and execution of the software can be performed on a computer system, such as further described infra, as a series of process or method modules or steps.

Figure 3:
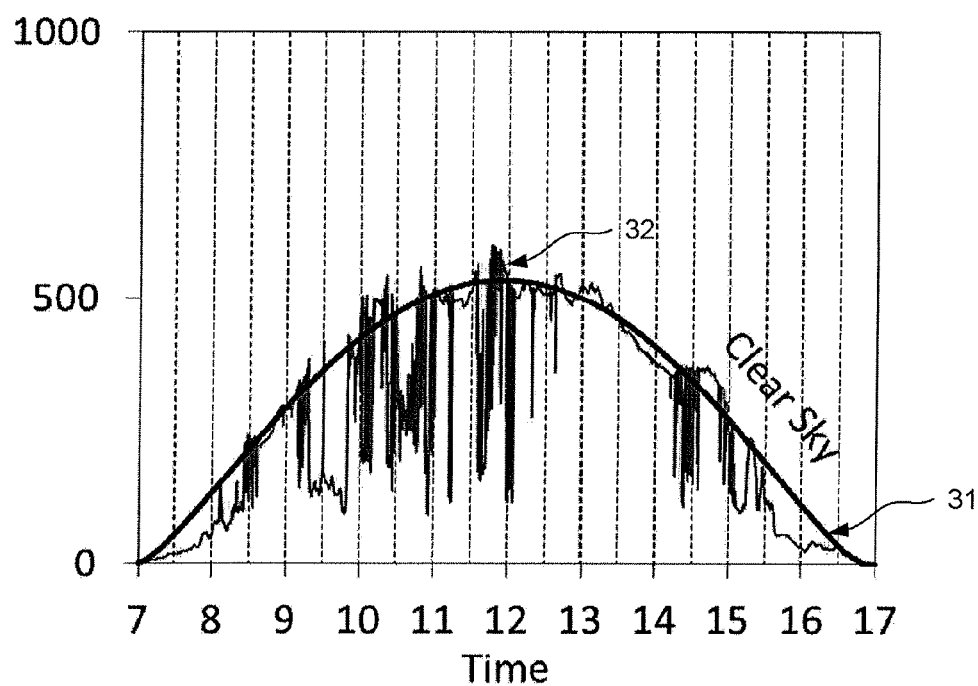
FIG. 3 is a graph depicting, by way of example, ten hours of time series irradiance data collected from a ground-based weather station with 10-second resolution.

A time series of solar irradiance or photovoltaic ("PV") data is first obtained (step 11) for a set of locations representative of the geographic region within which the photovoltaic fleet is located or intended to operate, as further described infra with reference to FIG. 3. Each time series contains solar irradiance observations measured or derived, then electronically recorded at a known sampling rate at fixed time intervals, such as at half-hour intervals, over successive observational time periods. The solar irradiance observations can include solar irradiance measured by a representative set of ground-based weather stations (step 12), existing photovoltaic systems (step 13), satellite observations (step 14), or some combination thereof. Other sources of the solar irradiance data are possible, including numeric weather prediction models.

Next, the solar irradiance data in the time series is converted over each of the time periods, such as at half-hour intervals, into a set of global horizontal irradiance clear sky indexes, which are calculated relative to clear sky global horizontal irradiance based on the type of solar irradiance data, such as described in commonly-assigned U.S. patent application, entitled "Computer-Implemented Method for Tuning Photovoltaic Power Generation Plant Forecasting," Ser. No. 13/677,175, filed Nov. 14, 2012, pending, the disclosure of which is incorporated by reference. The set of clearness indexes are interpreted into as irradiance statistics (step 15), as further described infra with reference to FIGS. 4-6, and power statistics, including a time series of the power statistics for the photovoltaic plant, are generated (step 17) as a function of the irradiance statistics and photovoltaic plant configuration (step 16). The photovoltaic plant configuration includes power generation and location information, including direct current ("DC") plant and photovoltaic panel ratings; number of power inverters; latitude, longitude and elevation; sampling and recording rates; sensor type, orientation, and number; voltage at point of delivery; tracking mode (fixed, single-axis tracking, dual-axis tracking), azimuth angle, tilt angle, row-to-row spacing, tracking rotation limit, and shading or other physical obstructions. Other types of information can also be included as part of the photovoltaic plant configuration. The resultant high-speed time series plant performance data can be combined to estimate photovoltaic fleet power output and variability, such as described in commonly-assigned U.S. Pat. Nos. 8,165,811; 8,165,812; 8,165,813; 8,326,535; 8,335,649; and 8,326,536, cited supra, for use by power grid planners, operators and other interested parties The calculated irradiance statistics are combined with the photovoltaic fleet configuration to generate the high-speed time series photovoltaic production data. In a further embodiment, the foregoing methodology may also require conversion of weather data for a region, such as data from satellite regions, to average point weather data. A non-optimized approach would be to calculate a correlation coefficient matrix on-the-fly for each satellite data point. Alternatively, a conversion factor for performing area-to-point conversion of satellite imagery data is described in commonly-assigned U.S. Pat. Nos. 8,165,813 and 8,326,536, cited supra.

Figure 2:
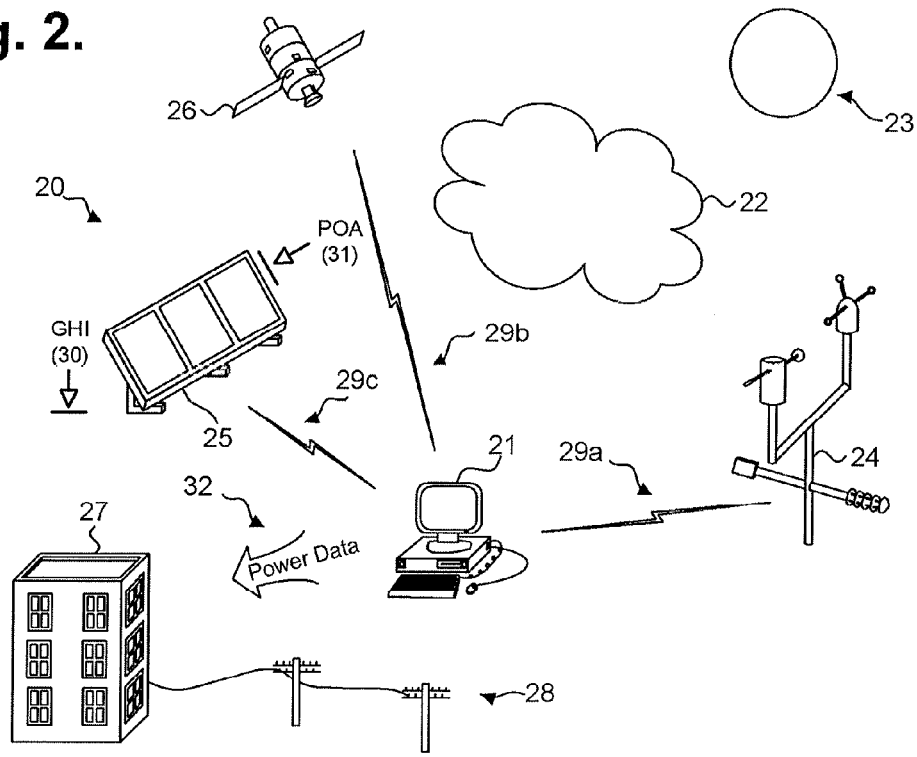
FIG. 2 is a block diagram showing a computer-implemented system for inferring operational specifications of a photovoltaic power generation system in accordance with a further embodiment.

Each forecast of power production data for a photovoltaic plant predicts the expected power output over a forecast period. FIG. 2 is a block diagram showing a computer-implemented system 20 for generating a probabilistic forecast of photovoltaic fleet power generation in accordance with one embodiment. Time series power output data 32 for a photovoltaic plant is generated using observed field conditions relating to overhead sky clearness. Solar irradiance 23 relative to prevailing cloudy conditions 22 in a geographic region of interest is measured. Direct solar irradiance measurements can be collected by ground-based weather stations 24. Solar irradiance measurements can also be derived or inferred by the actual power output of existing photovoltaic systems 25. Additionally, satellite observations 26 can be obtained for the geographic region. In a further embodiment, the solar irradiance can be generated by numerical weather prediction models. Both the direct and inferred solar irradiance measurements are considered to be sets of point values that relate to a specific physical location, whereas satellite imagery data is considered to be a set of area values that need to be converted into point values, such as described in commonly-assigned U.S. Pat. Nos. 8,165,813 and 8,326,536, cited supra. Still other sources of solar irradiance measurements are possible.

The solar irradiance measurements are centrally collected by a computer system 21 or equivalent computational device. The computer system 21 executes the methodology described supra with reference to FIG. 1 and as further detailed herein to generate time series power data 26 and other analytics, which can be stored or provided 27 to planners, operators, and other parties for use in solar power generation 28 planning and operations. In a further embodiment, the computer system 21 executes the methodology described infra beginning with reference to FIG. 19 for inferring operational specifications of a photovoltaic power generation system, which can be stored or provided 27 to planners and other interested parties for use in predicting individual and fleet power output generation. The data feeds 29a-c from the various sources of solar irradiance data need not be high speed connections; rather, the solar irradiance measurements can be obtained at an input data collection rate and application of the methodology described herein provides the generation of an output time series at any time resolution, even faster than the input time resolution. The computer system 21 includes hardware components conventionally found in a general purpose programmable computing device, such as a central processing unit, memory, user interfacing means, such as a keyboard, mouse, and display, input/output ports, network interface, and non-volatile storage, and execute software programs structured into routines, functions, and modules for execution on the various systems. In addition, other configurations of computational resources, whether provided as a dedicated system or arranged in client-server or peer-to-peer topologies, and including unitary or distributed processing, communications, storage, and user interfacing, are possible.

The detailed steps performed as part of the methodology described supra with reference to FIG. 1 will now be described.

Obtain Time Series Irradiance Data

The first step is to obtain time series irradiance data from representative locations. This data can be obtained from ground-based weather stations, existing photovoltaic systems, a satellite network, or some combination sources, as well as from other sources. The solar irradiance data is collected from several sample locations across the geographic region that encompasses the photovoltaic fleet.

Direct irradiance data can be obtained by collecting weather data from ground-based monitoring systems. FIG. 3 is a graph depicting, by way of example, ten hours of time series irradiance data collected from a ground-based weather station with 10-second resolution, that is, the time interval equals ten seconds. In the graph, the blue line 32 is the measured horizontal irradiance and the black line 31 is the calculated clear sky horizontal irradiance for the location of the weather station.

Irradiance data can also be inferred from select photovoltaic systems using their electrical power output measurements. A performance model for each photovoltaic system is first identified, and the input solar irradiance corresponding to the power output is determined.

Finally, satellite-based irradiance data can also be used. As satellite imagery data is pixel-based, the data for the geographic region is provided as a set of pixels, which span across the region and encompassing the photovoltaic fleet.

Calculate Irradiance Statistics

The time series irradiance data for each location is then converted into time series clearness index data, which is then used to calculate irradiance statistics, as described infra.

Clearness Index (Kt)

Figure 4:
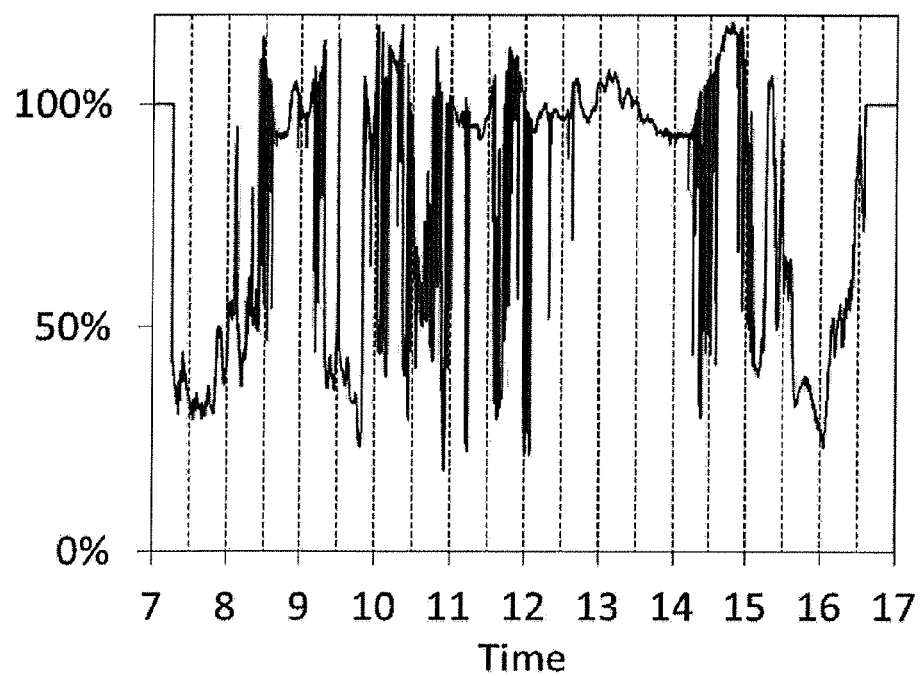
FIG. 4 is a graph depicting, by way of example, the clearness index that corresponds to the irradiance data presented in FIG. 3.

The clearness index (Kt) is calculated for each observation in the data set. In the case of an irradiance data set, the clearness index is determined by dividing the measured global horizontal irradiance by the clear sky global horizontal irradiance, may be obtained from any of a variety of analytical methods. FIG. 4 is a graph depicting, by way of example, the clearness index that corresponds to the irradiance data presented in FIG. 3. Calculation of the clearness index as described herein is also generally applicable to other expressions of irradiance and cloudy conditions, including global horizontal and direct normal irradiance.

Change in Clearness Index ($\Delta Kt$)

Figure 5:
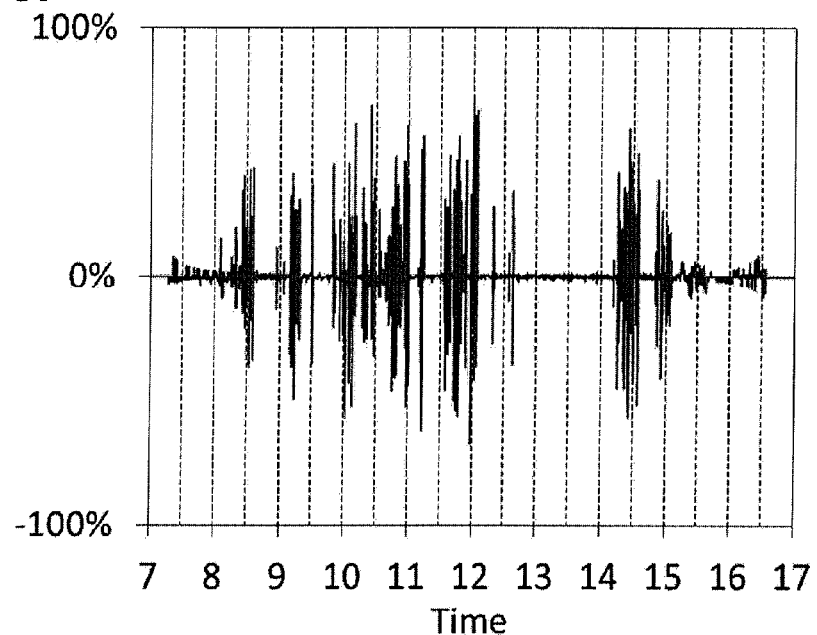
FIG. 5 is a graph depicting, by way of example, the change in clearness index that corresponds to the clearness index presented in FIG. 4.

The change in clearness index ($\Delta Kt$) over a time increment of is the difference between the clearness index starting at the beginning of a time increment t and the clearness index starting at the beginning of a time increment t, plus a time increment $\Delta t$. FIG. 5 is a graph depicting, by way of example, the change in clearness index that corresponds to the clearness index presented in FIG. 4.

Time Period

The time series data set is next divided into time periods, for instance, from five to sixty minutes, over which statistical calculations are performed. The determination of time period is selected depending upon the end use of the power output data and the time resolution of the input data. For example, if fleet variability statistics are to be used to schedule regulation reserves on a 30-minute basis, the time period could be selected as 30 minutes. The time period must be long enough to contain a sufficient number of sample observations, as defined by the data time interval, yet be short enough to be usable in the application of interest. An empirical investigation may be required to determine the optimal time period as appropriate.

Fundamental Statistics

Table 1 lists the irradiance statistics calculated from time series data for each time period at each location in the geographic region. Note that time period and location subscripts are not included for each statistic for purposes of notational simplicity.

TABLE 1

| Statistic | Variable |
|---|---|
| Mean clearness index | $\mu_{Kt}$ |
| Variance clearness index | $\sigma_{Kt}^2$ |
| Mean clearness index change | $\mu_{\Delta Kt}$ |
| Variance clearness index change | $\mu_{\Delta Kt}^2$ |

Table 2 lists sample clearness index time series data and associated irradiance statistics over five-minute time periods. The data is based on time series clearness index data that has a one-minute time interval. The analysis was performed over a five-minute time period. Note that the clearness index at 12:06 is only used to calculate the clearness index change and not to calculate the irradiance statistics.

TABLE 2

| | Clearness Index (Kt) | Clearness Index Change ($\Delta Kt$) |
|---|---|---|
| 12:00 | 50% | 40% |
| 12:01 | 90% | 0% |
| 12:02 | 90% | −80% |
| 12:03 | 10% | 0% |
| 12:04 | 10% | 80% |
| 12:05 | 90% | −40% |
| 12:06 | 50% | |
| Mean ($\mu$) | 57% | 0% |
| Variance ($\sigma^2$) | 13% | 27% |

The mean clearness index change equals the first clearness index in the succeeding time period, minus the first clearness index in the current time period divided by the number of time intervals in the time period. The mean clearness index change equals zero when these two values are the same. The mean is small when there are a sufficient number of time intervals. Furthermore, the mean is small relative to the clearness index change variance. To simplify the analysis, the mean clearness index change is assumed to equal zero for all time periods.

Figure 6:
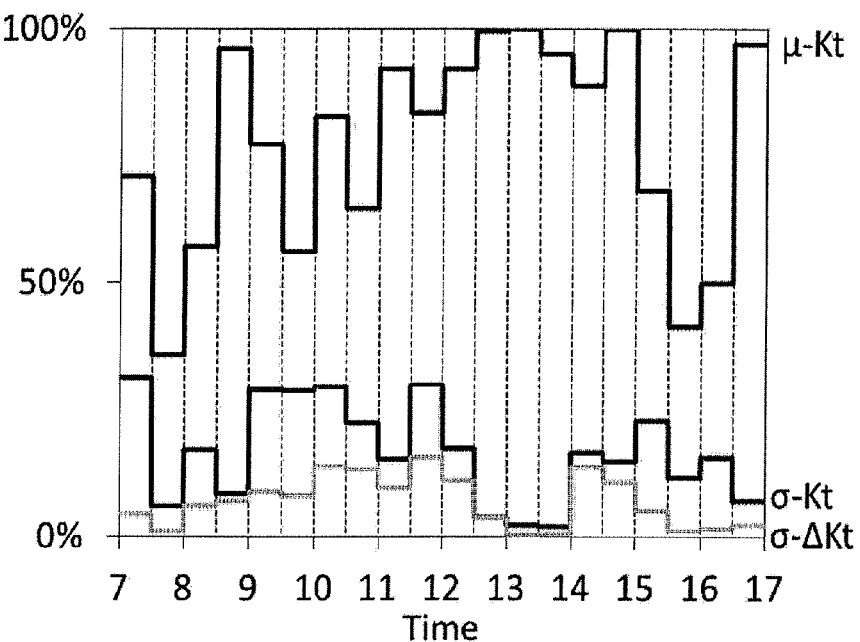
FIG. 6 is a graph depicting, by way of example, the irradiance statistics that correspond to the clearness index in FIG. 4 and the change in clearness index in FIG. 5.

FIG. 6 is a graph depicting, by way of example, the irradiance statistics that correspond to the clearness index in FIG. 4 and the change in clearness index in FIG. 5 using a half-hour hour time period. Note that FIG. 6 presents the standard deviations, determined as the square root of the variance, rather than the variances, to present the standard deviations in terms that are comparable to the mean.

Calculate Fleet Irradiance Statistics

Irradiance statistics were calculated in the previous section for the data stream at each sample location in the geographic region. The meaning of these statistics, however, depends upon the data source. Irradiance statistics calculated from a ground-based weather station data represent results for a specific geographical location as point statistics. Irradiance statistics calculated from satellite data represent results for a region as area statistics. For example, if a satellite pixel corresponds to a one square kilometer grid, then the results represent the irradiance statistics across a physical area one kilometer square.

Average irradiance statistics across the photovoltaic fleet region are a critical part of the methodology described herein. This section presents the steps to combine the statistical results for individual locations and calculate average irradiance statistics for the region as a whole. The steps differ depending upon whether point statistics or area statistics are used. Irradiance statistics derived from ground-based sources simply need to be averaged to form the average irradiance statistics across the photovoltaic fleet region. Irradiance statistics from satellite sources are first converted from irradiance statistics for an area into irradiance statistics for an average point within the pixel. The average point statistics are then averaged across all satellite pixels to determine the average across the photovoltaic fleet region.

Mean Clearness Index ($\mu_{\overline{Kt}}$) and Mean Change in Clearness Index ($\mu_{\overline{\Delta Kt}}$)

The mean clearness index should be averaged no matter what input data source is used, whether ground, satellite, or photovoltaic system originated data. If there are N locations, then the average clearness index across the photovoltaic fleet region is calculated as follows.

$$\mu_{\overline{Kt}} = \sum_{i=1}^{N} \frac{\mu_{Kt_i}}{N} \quad (1)$$

The mean change in clearness index for any period is assumed to be zero. As a result, the mean change in clearness index for the region is also zero.

$$\mu_{\overline{\Delta Kt}} = 0 \quad (2)$$

Convert Area Variance to Point Variance

The following calculations are required if satellite data is used as the source of irradiance data. Satellite observations represent values averaged across the area of the pixel, rather than single point observations. The clearness index derived from this data ($Kt^{Area}$) may therefore be considered an average of many individual point measurements.

$$Kt^{Area} = \sum_{i=1}^{N} \frac{Kt^i}{N} \quad (3)$$

As a result, the variance of the clearness index based on satellite data can be expressed as the variance of the average clearness index across all locations within the satellite pixel.

$$\sigma^2_{Kt-Area} = VAR[Kt^{Area}] = VAR\left[\sum_{i=1}^{N} \frac{Kt^i}{N}\right] \quad (4)$$

The variance of a sum, however, equals the sum of the covariance matrix.

$$\sigma^2_{Kt-Area} = \left(\frac{1}{N^2}\right) \sum_{i=1}^{N} \sum_{j=1}^{N} COV[Kt^i, Kt^j] \quad (5)$$

Let $\rho^{Kt^i,Kt^j}$ represents the correlation coefficient between the clearness index at location i and location j within the satellite pixel. By definition of correlation coefficient, $COV[Kt^i, Kt^j] = \sigma_{Kt}^i \sigma_{Kt}^j \rho Kt^{i,Kt^j}$. Furthermore, since the objective is to determine the average point variance across the satellite pixel, the standard deviation at any point within the satellite pixel can be assumed to be the same and equals $\sigma_{Kt}$, which means that $\sigma_{Kt}^i \sigma_{Kt}^j = \sigma_{Kt}^2$ for all location pairs. As a result, $COV[Kt^i, Kt^j] = \sigma_{Kt}^2 \rho^{Kt^i,Kt^j}$. Substituting this result into Equation (5) and simplify.

$$\sigma^2_{Kt-Area} = \sigma^2_{Kt}\left(\frac{1}{N^2}\right) \sum_{i=1}^{N} \sum_{j=1}^{N} \rho^{Kt^i,Kt^j} \quad (6)$$

Suppose that data was available to calculate the correlation coefficient in Equation (6). The computational effort required to perform a double summation for many points can be quite large and computationally resource intensive. For example, a satellite pixel representing a one square kilometer area contains one million square meter increments. With one million increments, Equation (6) would require one trillion calculations to compute.

The calculation can be simplified by conversion into a continuous probability density function of distances between location pairs across the pixel and the correlation coefficient for that given distance, as further described supra. Thus, the irradiance statistics for a specific satellite pixel, that is, an area statistic, rather than a point statistics, can be converted into the irradiance statistics at an average point within that pixel by dividing by a "Area" term (A), which corresponds to the area of the satellite pixel. Furthermore, the probability density function and correlation coefficient functions are generally assumed to be the same for all pixels within the fleet region, making the value of A constant for all pixels and reducing the computational burden further. Details as to how to calculate A are also further described supra.

$$\sigma^2_{Kt} = \frac{\sigma^2_{Kt-Area}}{A^{SatellitePixel}_{Kt}} \quad (7)$$

where:

$$A^{Satellite\ Pixel}_{Kt} = \left(\frac{1}{N^2}\right) \sum_{i=1}^{N} \sum_{j=1}^{N} \rho^{i,j} \quad (8)$$

Likewise, the change in clearness index variance across the satellite region can also be converted to an average point estimate using a similar conversion factor, $A_{\Delta Kt}^{Area}$.

$$\sigma^2_{\Delta Kt} = \frac{\sigma^2_{\Delta Kt-Area}}{A^{SatellitePixel}_{\Delta Kt}} \quad (9)$$

Variance of Clearness Index ($\sigma_{\overline{Kt}}^2$) and Variance of Change in Clearness Index ($\sigma_{\overline{\Delta Kt}}^2$)

At this point, the point statistics ($\sigma_{Kt}^2$ and $\sigma_{\Delta Kt}^2$) have been determined for each of several representative locations within the fleet region. These values may have been obtained from either ground-based point data or by converting satellite data from area into point statistics. If the fleet region is small, the variances calculated at each location i can be averaged to determine the average point variance across the fleet region. If there are N locations, then average variance of the clearness index across the photovoltaic fleet region is calculated as follows.

$$\sigma_{\overline{Kt}}^2 = \sum_{i=1}^{N} \frac{\sigma_{Kt_i}^2}{N} \quad (10)$$

Likewise, the variance of the clearness index change is calculated as follows.

$$\sigma_{\overline{\Delta Kt}}^2 = \sum_{i=1}^{N} \frac{\sigma_{\Delta Kt_i}^2}{N} \quad (11)$$

Calculate Fleet Power Statistics

The next step is to calculate photovoltaic fleet power statistics using the fleet irradiance statistics, as determined supra, and physical photovoltaic fleet configuration data. These fleet power statistics are derived from the irradiance statistics and have the same time period.

The critical photovoltaic fleet performance statistics that are of interest are the mean fleet power, the variance of the fleet power, and the variance of the change in fleet power over the desired time period. As in the case of irradiance statistics, the mean change in fleet power is assumed to be zero.

Photovoltaic System Power for Single System at Time t

Photovoltaic system power output (kW) is approximately linearly related to the AC-rating of the photovoltaic system (R in units of $kW_{AC}$) times plane-of-array irradiance. Plane-of-array irradiance can be represented by the clearness index over the photovoltaic system (KtPV) times the clear sky global horizontal irradiance times an orientation factor (O), which both converts global horizontal irradiance to plane-of-array irradiance and has an embedded factor that converts irradiance from Watts/m² to kW output/kW of rating. Thus, at a specific point in time (t), the power output for a single photovoltaic system (n) equals:

$$P_t^n = R^n O_t^n KtPV_t^n I_t^{Clear,n} \quad (12)$$

The change in power equals the difference in power at two different points in time.

$$\Delta P_{t,\Delta t}^n = R^n O_{t+\Delta t}^n KtPV_{t+\Delta t}^n I_{t+\Delta t}^{Clear,n} - R^n O_t^n KtPV_t^n I_t^{Clear,n} \quad (13)$$

The rating is constant, and over a short time interval, the two clear sky plane-of-array irradiances are approximately the same ($O_{t+\Delta t}^n I_{t+\Delta t}^{Clear,n} \approx O_t^n I_t^{Clear,n}$), so that the three terms can be factored out and the change in the clearness index remains.

$$\Delta P_{t,\Delta t}^n \approx R^n O_t^n I_t^{Clear,n} \Delta KtPV_t^n \quad (14)$$

Time Series Photovoltaic Power for Single System $P^n$ is a random variable that summarizes the power for a single photovoltaic system n over a set of times for a given time interval and set of time periods. $\Delta P^n$ is a random variable that summarizes the change in power over the same set of times.

Mean Fleet Power ($\mu_P$)

The mean power for the fleet of photovoltaic systems over the time period equals the expected value of the sum of the power output from all of the photovoltaic systems in the fleet.

$$\mu_P = E\left[\sum_{n=1}^{N} R^n O^n KtPV^n I^{Clear,n}\right] \quad (15)$$

If the time period is short and the region small, the clear sky irradiance does not change much and can be factored out of the expectation.

$$\mu_P = \mu_{I^{Clear}} E\left[\sum_{n=1}^{N} R^n O^n KtPV^n\right] \quad (16)$$

Again, if the time period is short and the region small, the clearness index can be averaged across the photovoltaic fleet region and any given orientation factor can be assumed to be a constant within the time period. The result is that:

$$\mu_P = R^{Adj.Fleet} \mu_{I^{Clear}} \mu_{\overline{Kt}} \quad (17)$$

where $\mu_{I^{Clear}}$ is calculated, $\mu \overline{Kt}$ is taken from Equation (1) and:

$$R^{Adj.Fleet} = \sum_{n=1}^{N} R^n O^n \quad (18)$$

This value can also be expressed as the average power during clear sky conditions times the average clearness index across the region.

$$\mu_P = \mu_P^{Clear} \mu_{\overline{Kt}} \quad (19)$$

Variance of Fleet Power ($\sigma_P^2$)

The variance of the power from the photovoltaic fleet equals:

$$\sigma_P^2 = VAR\left[\sum_{n=1}^{N} R^n O^n KtPV^n I^{Clear,n}\right] \quad (20)$$

If the clear sky irradiance is the same for all systems, which will be the case when the region is small and the time period is short, then:

$$\sigma_P^2 = VAR\left[I^{Clear} \sum_{n=1}^{N} R^n O^n KtPV^n\right] \quad (21)$$

The variance of a product of two independent random variables X, Y, that is, VAR[XY]) equals $E[X]^2 VAR[Y] + E[Y]^2 VAR[X] + VAR[X] VAR[Y]$. If the X random variable has a large mean and small variance relative to the other terms, then $VAR[XY] \approx E[X]^2 VAR[Y]$. Thus, the clear sky irradiance can be factored out of Equation (21) and can be written as:

$$\sigma_P^2 = (\mu_{I^{Clear}})^2 VAR\left[\sum_{n=1}^{N} R^n KtPV^n O^n\right] \quad (22)$$

The variance of a sum equals the sum of the covariance matrix.

$$\sigma_P^2 = (\mu_{I^{Clear}})^2 \left(\sum_{i=1}^{N}\sum_{j=1}^{N} COV[R^i KtPV^i O^i, R^j KtPV^j O^j]\right) \quad (23)$$

In addition, over a short time period, the factor to convert from clear sky GHI to clear sky POA does not vary much and becomes a constant. All four variables can be factored out of the covariance equation.

$$\sigma_P^2 = (\mu_{I^{Clear}})^2 \left(\sum_{i=1}^{N}\sum_{j=1}^{N} (R^i O^i)(R^j O^j) COV[KtPV^i, KtPV^j]\right) \quad (24)$$

For any $i$ and $j$, $COV[KtPV^i, KtPV^j] = \sqrt{\sigma_{KtPV^i}^2 \sigma_{KtPV^2}^2} \rho^{Kt^i,Kt^j}$.

$$\sigma_P^2 = (\mu_{I^{Clear}})^2 \left(\sum_{i=1}^{N}\sum_{j=1}^{N} (R^i O^i)(R^j O^j)\sqrt{\sigma_{KtPV^i}^2 \sigma_{KtPV^j}^2} \rho^{Kt^i,Kt^j}\right) \quad (25)$$

As discussed supra, the variance of the satellite data required a conversion from the satellite area, that is, the area covered by a pixel, to an average point within the satellite area. In the same way, assuming a uniform clearness index across the region of the photovoltaic plant, the variance of the clearness index across a region the size of the photovoltaic plant within the fleet also needs to be adjusted. The same approach that was used to adjust the satellite clearness index can be used to adjust the photovoltaic clearness index. Thus, each variance needs to be adjusted to reflect the area that the $i^{th}$ photovoltaic plant covers.

$$\sigma_{KtPV}^2 = A_{Kt}^i \sigma_{\frac{2}{Kt}} \quad (26)$$

Substituting and then factoring the clearness index variance given the assumption that the average variance is constant across the region yields:

$$\sigma_P^2 = (R^{Adj.Fleet} \mu_{I^{Clear}})^2 P^{Kt} \sigma_{\frac{2}{Kt}} \quad (27)$$

where the correlation matrix equals:

$$P^{Kt} = \frac{\sum_{i=1}^{N}\sum_{j=1}^{N} (R^i O^i A_{Kt}^i)(R^j O^j A_{Kt}^j)\rho^{Kt^i,Kt^j}}{\left(\sum_{n=1}^{N} R^n O^n\right)^2} \quad (28)$$

$R^{Adj.Fleet}\mu_{I^{Clear}}$ in Equation (27) can be written as the power produced by the photovoltaic fleet under clear sky conditions, that is:

$$\sigma_P^2 = \mu_{P^{Clear}2} P^{Kt} \sigma_{\frac{2}{Kt}} \quad (29)$$

If the region is large and the clearness index mean or variances vary substantially across the region, then the simplifications may not be able to be applied. Notwithstanding, if the simplification is inapplicable, the systems are likely located far enough away from each other, so as to be independent. In that case, the correlation coefficients between plants in different regions would be zero, so most of the terms in the summation are also zero and an inter-regional simplification can be made. The variance and mean then become the weighted average values based on regional photovoltaic capacity and orientation.

Discussion

In Equation (28), the correlation matrix term embeds the effect of intra-plant and inter-plant geographic diversification. The area-related terms (A) inside the summations reflect the intra-plant power smoothing that takes place in a large plant and may be calculated using the simplified relationship, as further discussed supra. These terms are then weighted by the effective plant output at the time, that is, the rating adjusted for orientation. The multiplication of these terms with the correlation coefficients reflects the inter-plant smoothing due to the separation of photovoltaic systems from one another.

Variance of Change in Fleet Power ($\sigma_{\Delta P}^2$)

A similar approach can be used to show that the variance of the change in power equals:

$$\sigma_{\Delta P}^2 = \mu_{P^{Clear}2} P^{\Delta Kt} \sigma_{\frac{2}{\Delta Kt}} \quad (30)$$

where $$P^{\Delta Kt} = \frac{\sum_{i=1}^{N}\sum_{k=1}^{N} (R^i O^i A_{\Delta Kt}^i)(R^j O^j A_{\Delta Kt}^j)\rho^{\Delta Kt^i,\Delta Kt^j}}{\left(\sum_{n=1}^{N} R^n O^n\right)^2} \quad (31)$$

The determination of Equations (30) and (31) becomes computationally intensive as the network of points becomes large. For example, a network with 10,000 photovoltaic systems would require the computation of a correlation coefficient matrix with 100 million calculations. The computational burden can be reduced in two ways. First, many of the terms in the matrix are zero because the photovoltaic systems are located too far away from each other. Thus, the double summation portion of the calculation can be simplified to eliminate zero values based on distance between locations by construction of a grid of points. Second, once the simplification has been made, rather than calculating the matrix on-the-fly for every time period, the matrix can be calculated once at the beginning of the analysis for a variety of cloud speed conditions, and then the analysis would simply require a lookup of the appropriate value.

Time Lag Correlation Coefficient

The next step is to adjust the photovoltaic fleet power statistics from the input time interval to the desired output time interval. For example, the time series data may have been collected and stored every 60 seconds. The user of the results, however, may want to have photovoltaic fleet power statistics at a 10-second rate. This adjustment is made using the time lag correlation coefficient.

The time lag correlation coefficient reflects the relationship between fleet power and that same fleet power starting one time interval ($\Delta t$) later. Specifically, the time lag correlation coefficient is defined as follows:

$$\rho^{P,P^{\Delta t}} = \frac{COV[P, P^{\Delta t}]}{\sqrt{\sigma_P^2 \sigma_{P^{\Delta t}}^2}} \tag{32}$$

The assumption that the mean clearness index change equals zero implies that $\sigma_{P^{\Delta t}}^2 = \sigma_P^2$. Given a non-zero variance of power, this assumption can also be used to show that $$\frac{COV[P, P^{\Delta t}]}{\sigma_P^2} = 1 - \frac{\sigma_{\Delta P}^2}{2\sigma_P^2}.$$

Therefore:

$$\rho^{P,P^{\Delta t}} = 1 - \frac{\sigma_{\Delta P}^2}{2\sigma_P^2} \tag{33}$$

This relationship illustrates how the time lag correlation coefficient for the time interval associated with the data collection rate is completely defined in terms of fleet power statistics already calculated. A more detailed derivation is described infra.

Equation (33) can be stated completely in terms of the photovoltaic fleet configuration and the fleet region clearness index statistics by substituting Equations (29) and (30). Specifically, the time lag correlation coefficient can be stated entirely in terms of photovoltaic fleet configuration, the variance of the clearness index, and the variance of the change in the clearness index associated with the time increment of the input data.

$$\rho^{P,P^{\Delta t}} = 1 - \frac{P^{\Delta Kt} \frac{\sigma_{\Delta Kt}^2}{2}}{2 P^{Kt} \sigma_{Kt}^2} \tag{34}$$

Generate High-Speed Time Series Photovoltaic Fleet Power

The final step is to generate high-speed time series photovoltaic fleet power data based on irradiance statistics, photovoltaic fleet configuration, and the time lag correlation coefficient. This step is to construct time series photovoltaic fleet production from statistical measures over the desired time period, for instance, at half-hour output intervals.

A joint probability distribution function is required for this step. The bivariate probability density function of two unit normal random variables (X and Y) with a correlation coefficient of $\rho$ equals:

$$f(x, y) = \frac{1}{2\pi\sqrt{1-\rho^2}} \exp\left[-\frac{(x^2 + y^2 - 2\rho xy)}{2(1-\rho^2)}\right] \tag{35}$$

The single variable probability density function for a unit normal random variable X alone is $$f(x) = \frac{1}{\sqrt{2\pi}} \exp\left(-\frac{x^2}{2}\right).$$

In addition, a conditional distribution for y can be calculated based on a known x by dividing the bivariate probability density function by the single variable probability density $$\left(\text{i.e., } f(y \mid x) = \frac{f(x, y)}{f(x)}\right).$$

Making the appropriate substitutions, the result is that the conditional distribution of y based on a known x equals:

$$f(y \mid x) = \frac{1}{\sqrt{2\pi}\sqrt{1-\rho^2}} \exp\left[-\frac{(y - \rho x)^2}{2(1-\rho^2)}\right] \tag{36}$$

Define a random variable $$Z = \frac{Y - \rho x}{\sqrt{1-\rho^2}}$$

and substitute into Equation (36). The result is that the conditional probability of z given a known x equals:

$$f(z \mid x) = \frac{1}{\sqrt{2\pi}} \exp\left(-\frac{z^2}{2}\right) \tag{37}$$

The cumulative distribution function for Z can be denoted by $\phi(z^*)$, where $z^*$ represents a specific value for z. The result equals a probability (p) that ranges between 0 (when $z^* = -\infty$) and 1 (when $z^* = \infty$). The function represents the cumulative probability that any value of z is less than $z^*$, as determined by a computer program or value lookup.

$$p = \phi(z^*) = \frac{1}{\sqrt{2\pi}} \int_{-\infty}^{z^*} \exp\left(-\frac{z^2}{2}\right) dz \int \tag{38}$$

Rather than selecting $z^*$, however, a probability p falling between 0 and 1 can be selected and the corresponding $z^*$ that results in this probability found, which can be accomplished by taking the inverse of the cumulative distribution function.

$$\phi^{-1}(p) = z^* \tag{39}$$

Substituting back for z as defined above results in:

$$\phi^{-1}(p) = \frac{y - \rho x}{\sqrt{1-\rho^2}} \quad (40)$$

Now, let the random variables equal $$X = \frac{P - \mu_P}{\sigma^P} \text{ and } Y = \frac{P^{\Delta t} - \mu_{P^{\Delta t}}}{\sigma_{P^{\Delta t}}},$$

with the correlation coefficient being the time lag correlation coefficient between P and $P^{\Delta t}$ (i.e., let $\rho = \rho^{P,P^{\Delta t}}$). When $\Delta t$ is small, then the mean and standard deviations for $P^{\Delta t}$ are approximately equal to the mean and standard deviation for P. Thus, Y can be restated as $$Y \approx \frac{P^{\Delta t} - \mu_P}{\sigma_P}.$$

Add a time subscript to all of the relevant data to represent a specific point in time and substitute x, y, and p into Equation (40).

$$\phi^{-1}(p) = \frac{\left(\frac{P^{\Delta t}_t - \mu_P}{\sigma_P}\right) - \rho^{P,P^{\Delta t}}\left(\frac{P_t - \mu_P}{\sigma_P}\right)}{\sqrt{1-\rho^{P,P^{\Delta t}2}}} \quad (41)$$

The random variable $P^{\Delta t}$, however, is simply the random variable P shifted in time by a time interval of $\Delta t$. As a result, at any given time t, $P^{\Delta t}_t = P_{t+\Delta t}$. Make this substitution into Equation (41) and solve in terms of $P_{t+\Delta t}$.

$$P_{t+\Delta t} = \rho^{P,P^{\Delta t}} P_t + (1 - \rho^{P,P^{\Delta t}})\mu_P + \sqrt{\sigma_P^2(1-\rho^{P,P^{\Delta t}2})}\,\phi^{-1}(p) \quad (42)$$

At any given time, photovoltaic fleet power equals photovoltaic fleet power under clear sky conditions times the average regional clearness index, that is, $P_t = P_t^{Clear} Kt_t$. In addition, over a short time period, $$\mu_P \approx P_t^{Clear}\mu_{\overline{Kt}} \text{ and } \sigma_P^2 \approx (P_t^{Clear})^2 P^{Kt}\sigma\frac{2}{Kt}.$$

Substitute these three relationships into Equation (42) and factor out photovoltaic fleet power under clear sky conditions $((P_t^{Clear}))$ as common to all three terms.

$$P_{t+\Delta t} = P_t^{Clear} \left[ \begin{array}{c} \rho^{P,P^{\Delta t}} Kt_t + (1-\rho^{P,P^{\Delta t}})\mu_{\overline{Kt}} + \\ \sqrt{P^{Kt}\sigma\frac{2}{Kt}(1-\rho^{P,P^{\Delta t}2})}\,\phi^{-1}(p_t) \end{array} \right] \quad (43)$$

Equation (43) provides an iterative method to generate high-speed time series photovoltaic production data for a fleet of photovoltaic systems. At each time step ($t+\Delta t$), the power delivered by the fleet of photovoltaic systems ($P_{t+\Delta t}$) is calculated using input values from time step t. Thus, a time series of power outputs can be created. The inputs include:

$P_t^{Clear}$—photovoltaic fleet power during clear sky conditions calculated using a photovoltaic simulation program and clear sky irradiance.

$Kt_t$—average regional clearness index inferred based on $P_t$ calculated in time step t, that is, $$Kt_t = \frac{P_t}{P_t^{Clear}}.$$

$\mu_{\overline{Kt}}$—mean clearness index calculated using time series irradiance data and Equation (1).

$$\sigma\frac{2}{Kt}$$

—variance of the clearness index calculated using time series irradiance data and Equation (10).

$\rho^{P,P^{\Delta t}}$—fleet configuration as reflected in the time lag correlation coefficient calculated using Equation (34). In turn, Equation (34), relies upon correlation coefficients from Equations (28) and (31). A method to obtain these correlation coefficients by empirical means is described in commonly-assigned U.S. patent application, entitled "Computer-Implemented System and Method for Determining Point-To-Point Correlation Of Sky Clearness for Photovoltaic Power Generation Fleet Output Estimation," Ser. No. 13/190,435, filed Jul. 25, 2011, pending, and U.S. patent application, entitled "Computer-Implemented System and Method for Efficiently Performing Area-To-Point Conversion of Satellite Imagery for Photovoltaic Power Generation Fleet Output Estimation," Ser. No. 13/190,449, filed Jul. 25, 2011, pending, the disclosure of which is incorporated by reference.

$P^{Kt}$—fleet configuration as reflected in the clearness index correlation coefficient matrix calculated using Equation (28) where, again, the correlation coefficients may be obtained using the empirical results as further described infra.

$\phi^{-1}(p_t)$—the inverse cumulative normal distribution function based on a random variable between 0 and 1.

Derivation of Empirical Models

The previous section developed the mathematical relationships used to calculate irradiance and power statistics for the region associated with a photovoltaic fleet. The relationships between Equations (8), (28), (31), and (34) depend upon the ability to obtain point-to-point correlation coefficients. This section presents empirically-derived models that can be used to determine the value of the coefficients for this purpose.

Figure 7A:
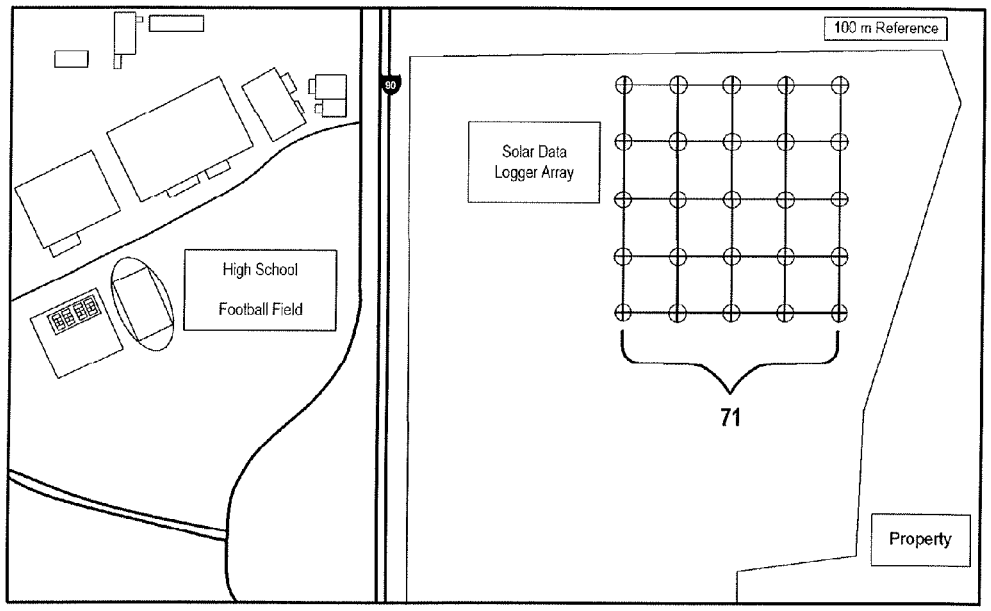
FIGS. 7A-7B are photographs showing, by way of example, the locations of the Cordelia Junction and Napa high density weather monitoring stations.
Figure 7B:
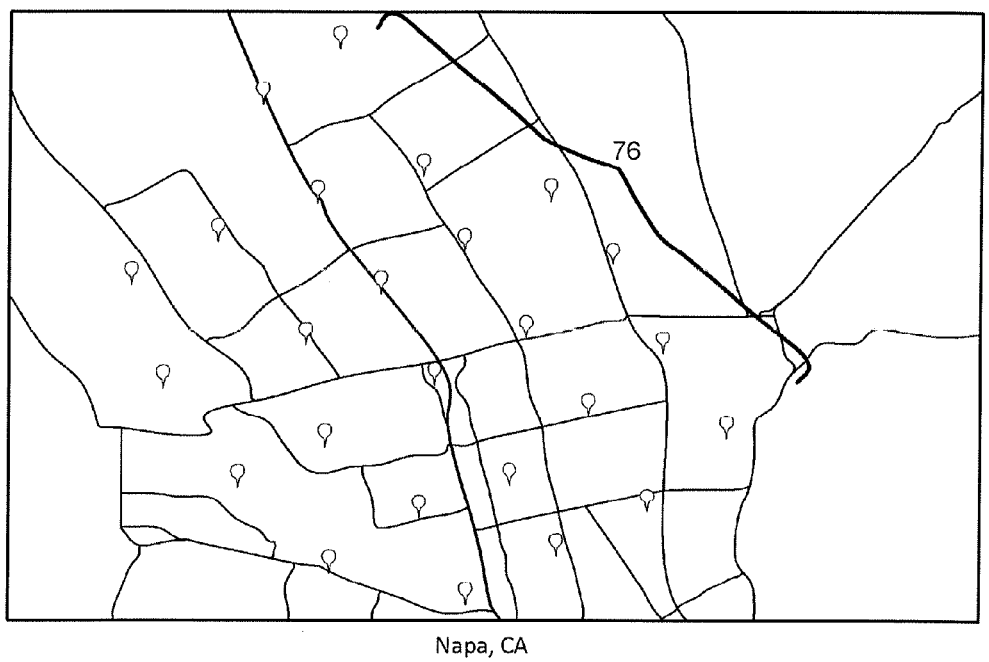

A mobile network of 25 weather monitoring devices was deployed in a 400 meter by 400 meter grid in Cordelia Junction, Calif., between Nov. 6, 2010, and Nov. 15, 2010, and in a 4,000 meter by 4,000 meter grid in Napa, Calif., between Nov. 19, 2010, and Nov. 24, 2010. FIGS. 7A-7B are photographs showing, by way of example, the locations of the Cordelia Junction and Napa high density weather monitoring stations.

An analysis was performed by examining results from Napa and Cordelia Junction using 10, 30, 60, 120 and 180 second time intervals over each half-hour time period in the data set. The variance of the clearness index and the variance of the change in clearness index were calculated for each of the 25 locations for each of the two networks. In addition, the clearness index correlation coefficient and the change in clearness index correlation coefficient for each of the 625 possible pairs, 300 of which are unique, for each of the two locations were calculated.

An empirical model is proposed as part of the methodology described herein to estimate the correlation coefficient of the clearness index and change in clearness index between any two points by using as inputs the following: distance between the two points, cloud speed, and time interval. For the analysis, distances were measured, cloud speed was implied, and a time interval was selected.

The empirical models infra describe correlation coefficients between two points (i and j), making use of "temporal distance," defined as the physical distance (meters) between points i and j, divided by the regional cloud speed (meters per second) and having units of seconds. The temporal distance answers the question, "How much time is needed to span two locations?"

Cloud speed was estimated to be six meters per second. Results indicate that the clearness index correlation coefficient between the two locations closely matches the estimated value as calculated using the following empirical model:

$$\rho^{Kt^i,Kt^j} = \exp(C_1 \times \text{TemporalDistance})^{\text{ClearnessPower}} \quad (44)$$

where TemporalDistance=Distance (meters)/CloudSpeed (meters per second), Clearness Power=$\ln(C_2 \Delta t)$−k, such that 5≤k≤15, where the expected value is k=9.3, $\Delta t$ is the desired output time interval (seconds), and $C_1 = 10^{-3}$ seconds$^{-1}$, and $C_2 = 1$ seconds$^{-1}$.

Results also indicate that the correlation coefficient for the change in clearness index between two locations closely matches the values calculated using the following empirical relationship:

$$\rho^{\Delta Kt^i, \Delta Kt^j} = (\rho^{Kt^i, Kt^j})^{\Delta \text{ClearnessPower}} \quad (45)$$

where $\rho^{Kt^i, Kt^j}$ is calculated using Equation (44) and $$\Delta \text{ClearnessPower} = 1 + \frac{m}{C_2 \Delta t},$$

such that 100≥m≥200, where the expected value is m=140.

Empirical results also lead to the following models that may be used to translate the variance of clearness index and the variance of change in clearness index from the measured time interval ($\Delta t$ ref) to the desired output time interval ($\Delta t$).

$$\sigma^2_{Kt_{\Delta t}} = \sigma^2_{Kt^2_{\Delta tref}} \exp\left[1 - \left(\frac{\Delta t}{\Delta t \, ref}\right)^{C_3}\right] \quad (46)$$

$$\sigma^2_{\Delta Kt_{\Delta t}} = \sigma^2_{\Delta Kt_{\Delta tref}} \left\{1 - 2\left[1 - \left(\frac{\Delta t}{\Delta t \, ref}\right)^{C_3}\right]\right\} \quad (47)$$

where $C_3 = 0.1 \leq C_3 \leq 0.2$, where the expected value is $C_3 = 0.15$.

Figure 8A:
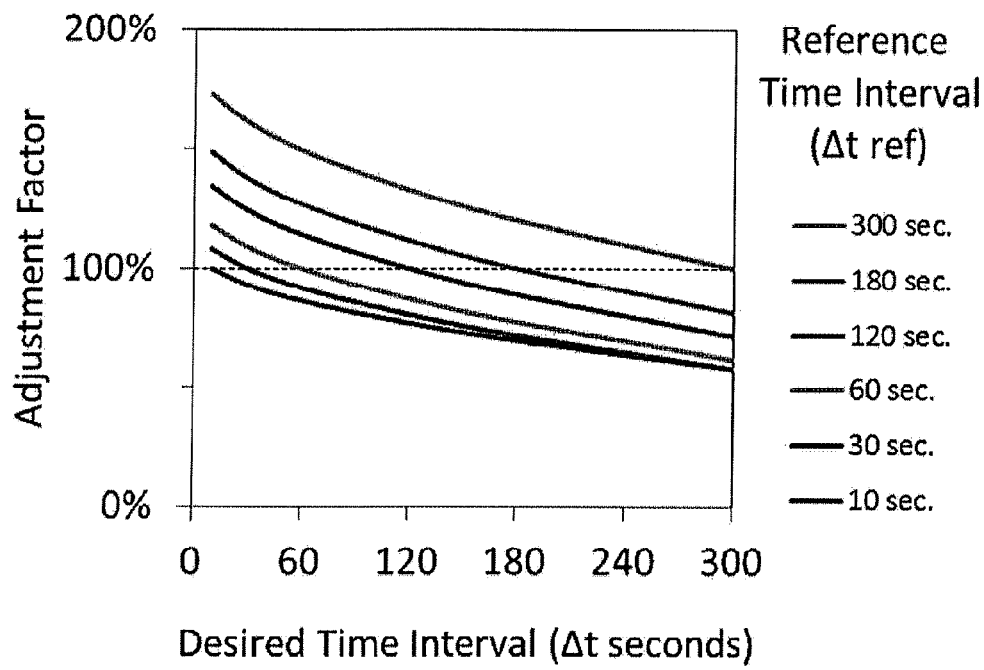
FIGS. 8A-8B are graphs depicting, by way of example, the adjustment factors plotted for time intervals from 10 seconds to 300 seconds.
Figure 8B:
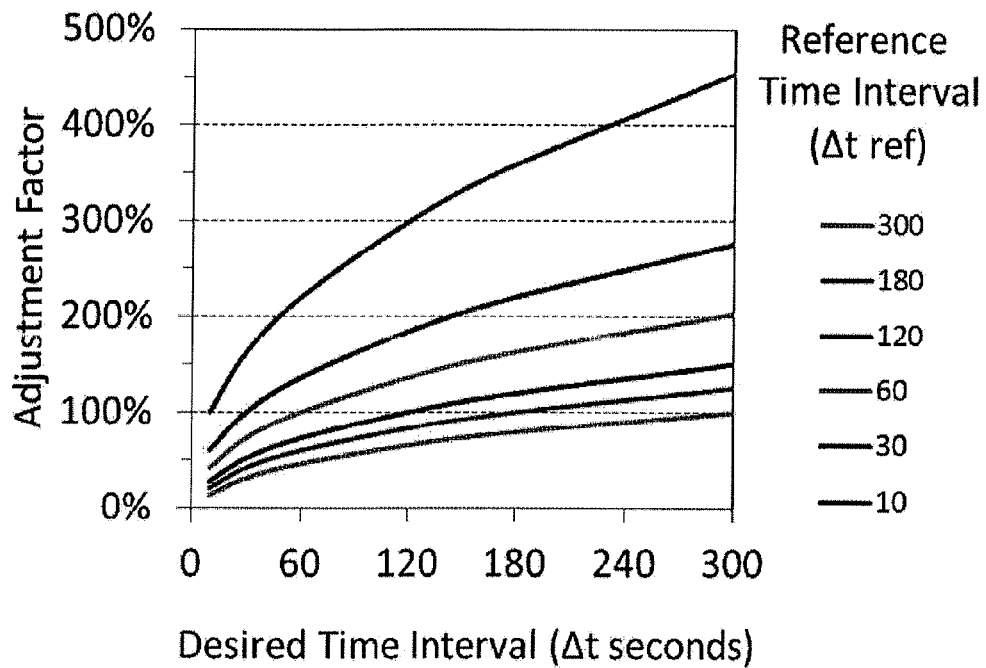
Figure 9A:
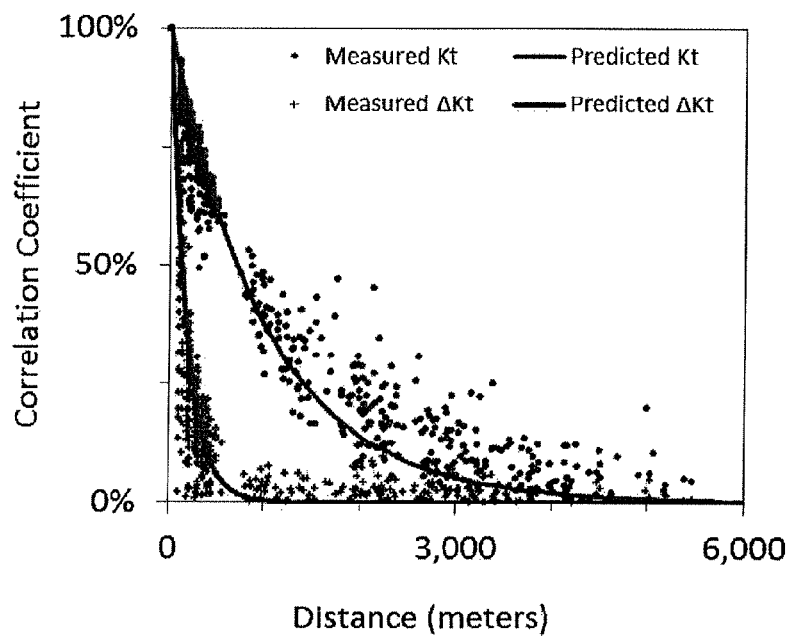
FIGS. 9A-9F are graphs depicting, by way of example, the measured and predicted weighted average correlation coefficients for each pair of locations versus distance.
Figure 9B:
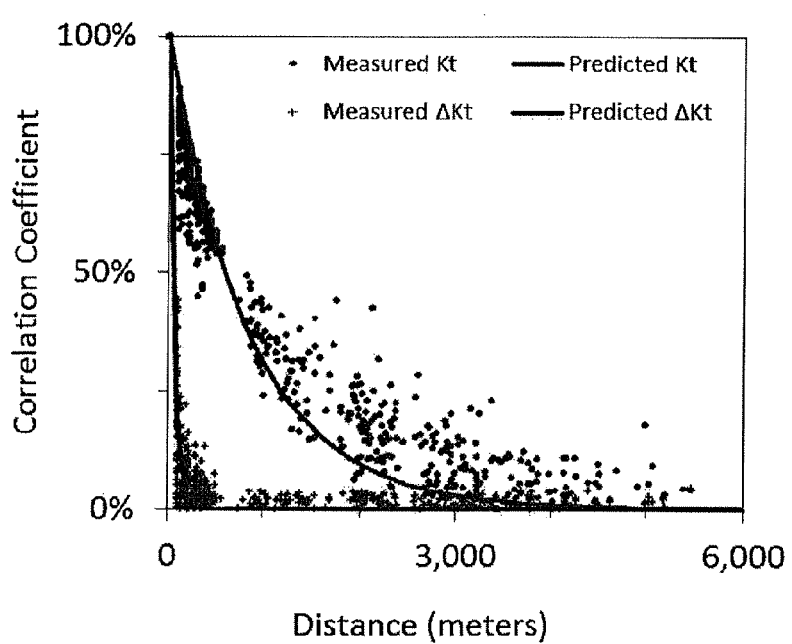
Figure 9C:
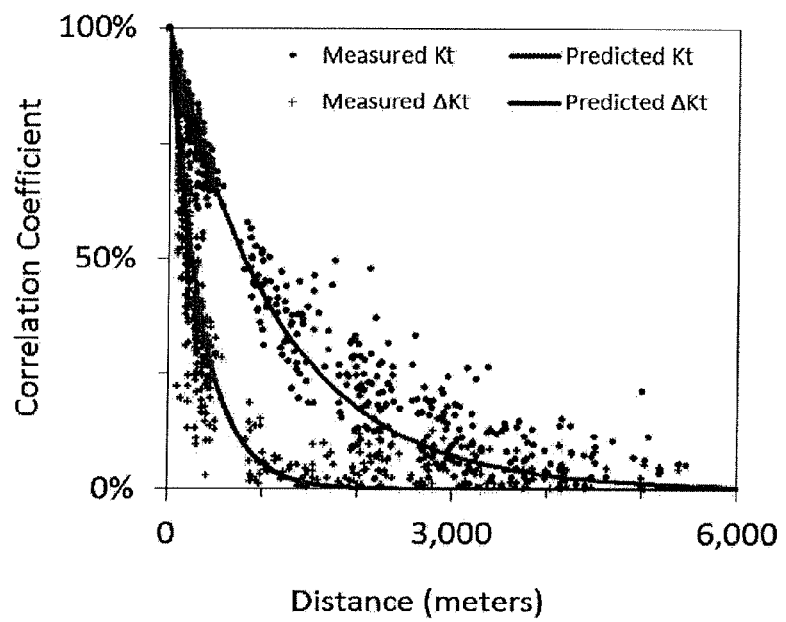
Figure 9D:
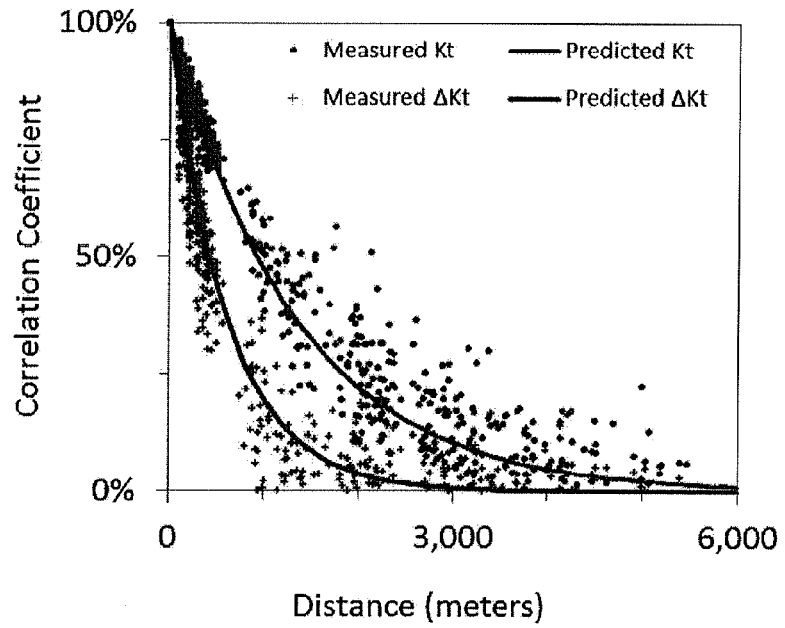
Figure 9E:
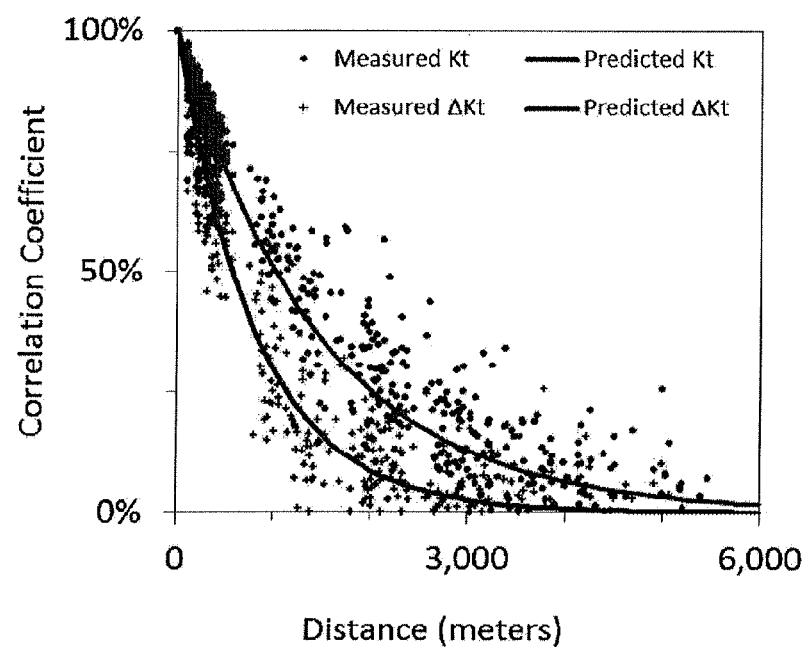
Figure 9F:
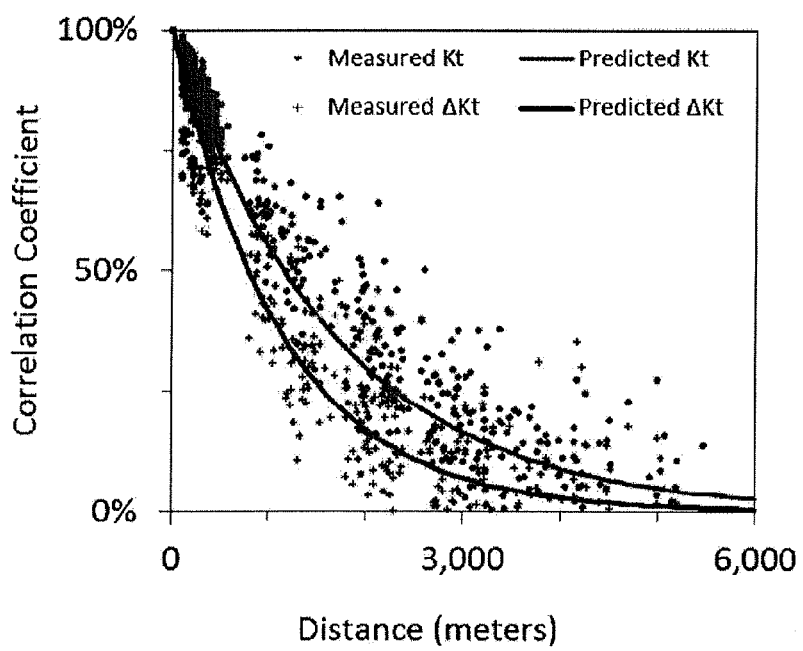
Figure 10A:
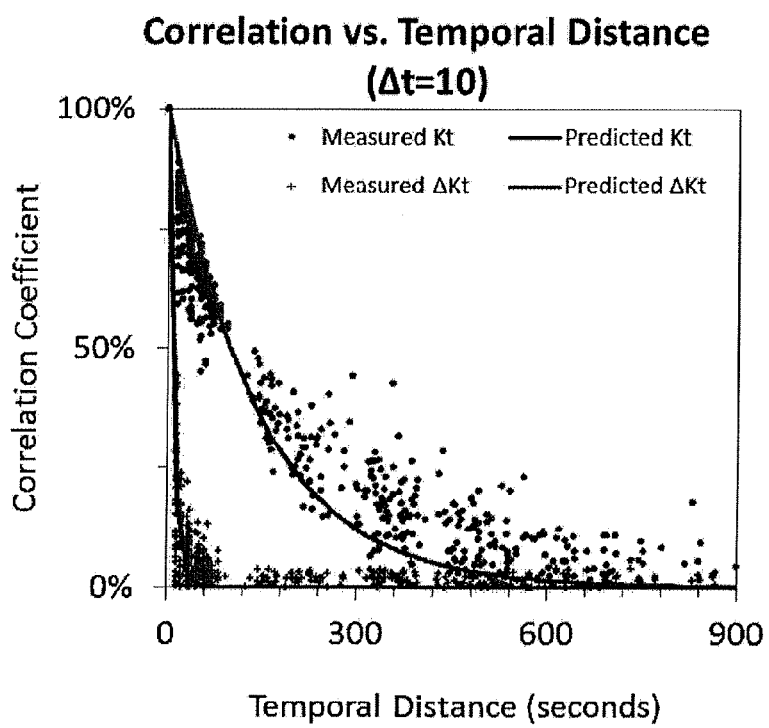
FIGS. 10A-10F are graphs depicting, by way of example, the same information as depicted in FIGS. 9A-9F versus temporal distance.
Figure 10B:
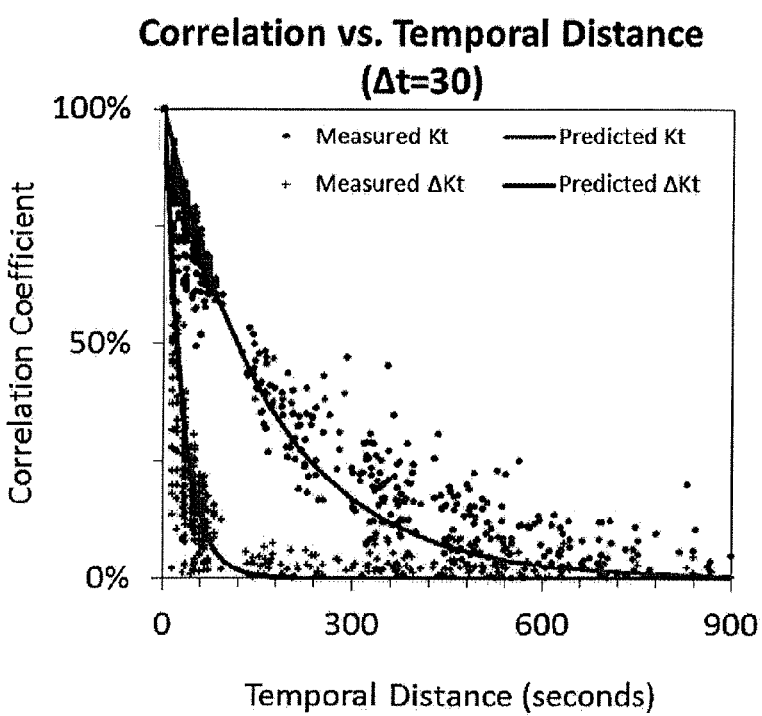
Figure 10C:
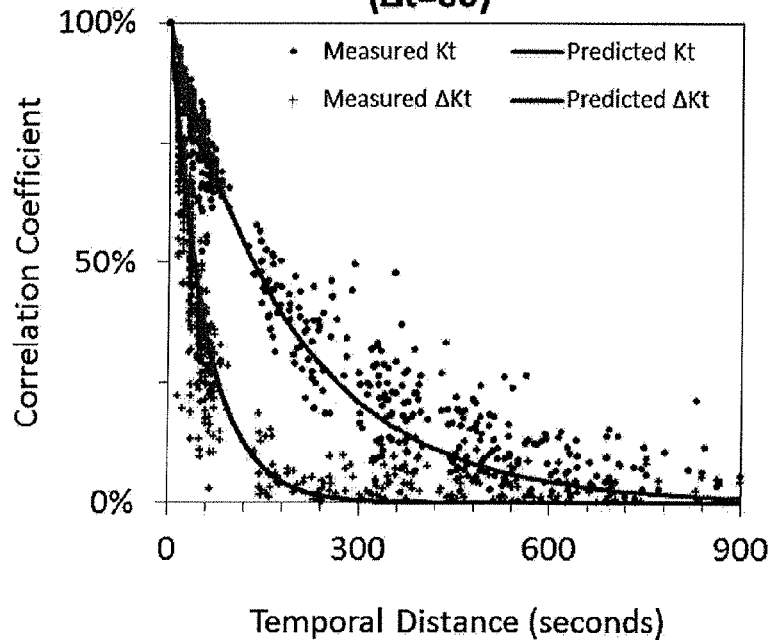
Figure 10D:
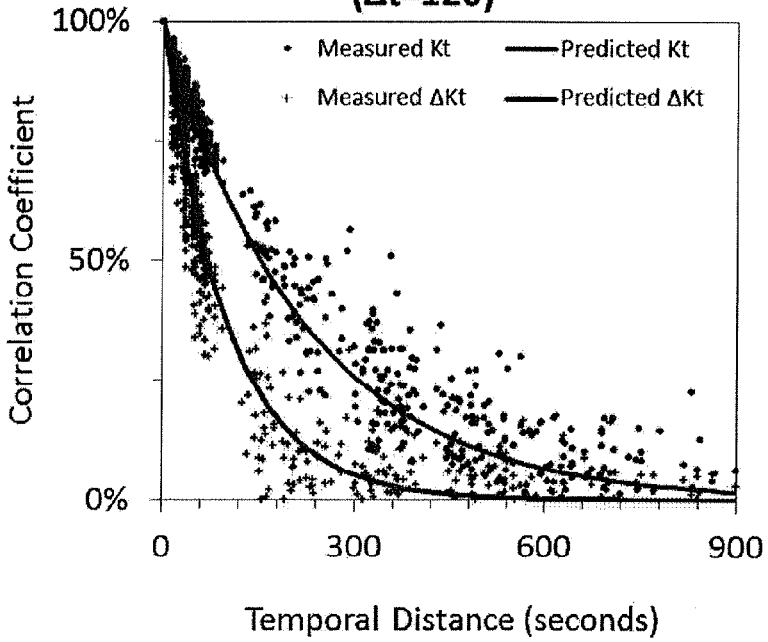
Figure 10E:
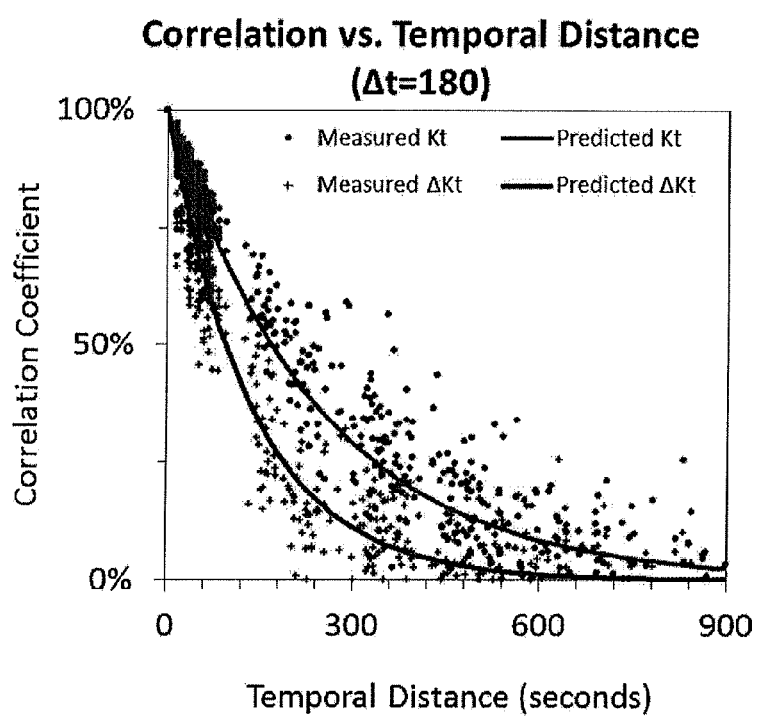
Figure 10F:
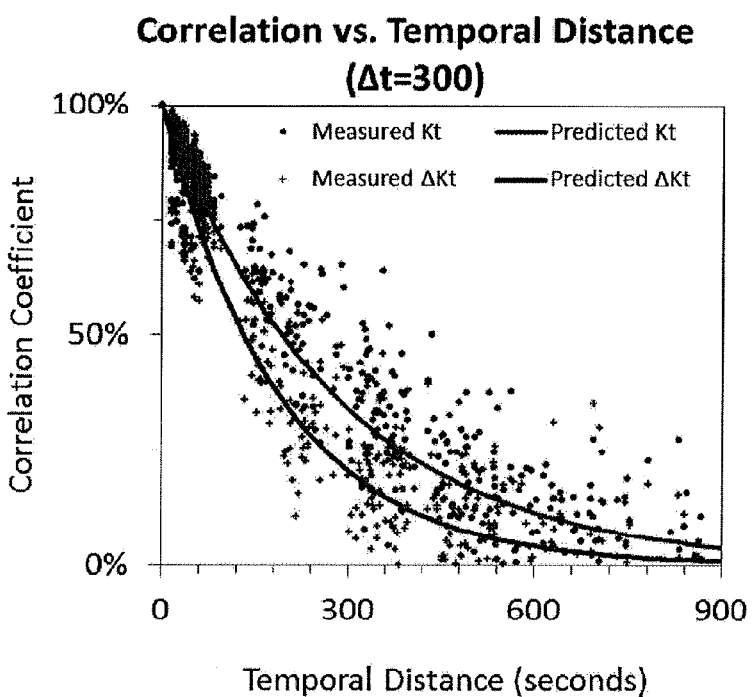
Figure 11A:
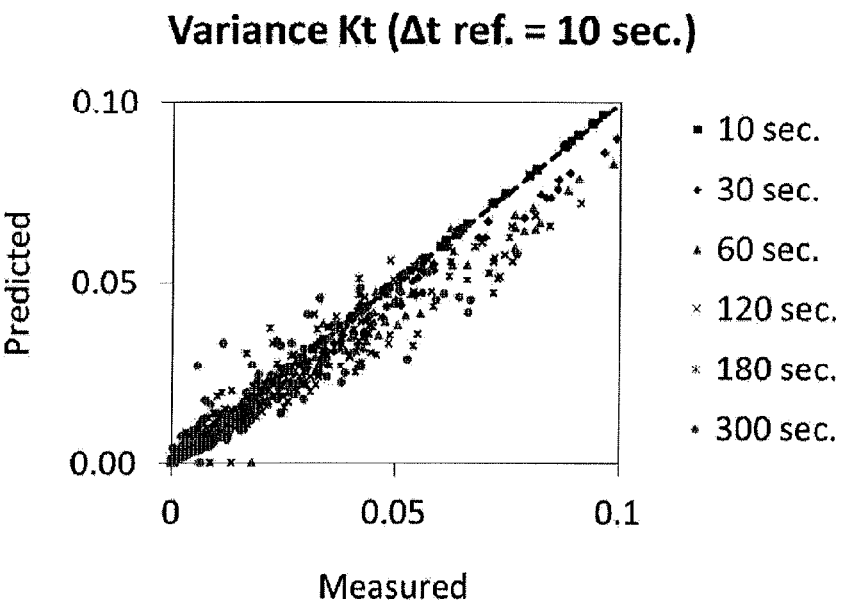
FIGS. 11A-11F are graphs depicting, by way of example, the predicted versus the measured variances of clearness indexes using different reference time intervals.
Figure 11B:
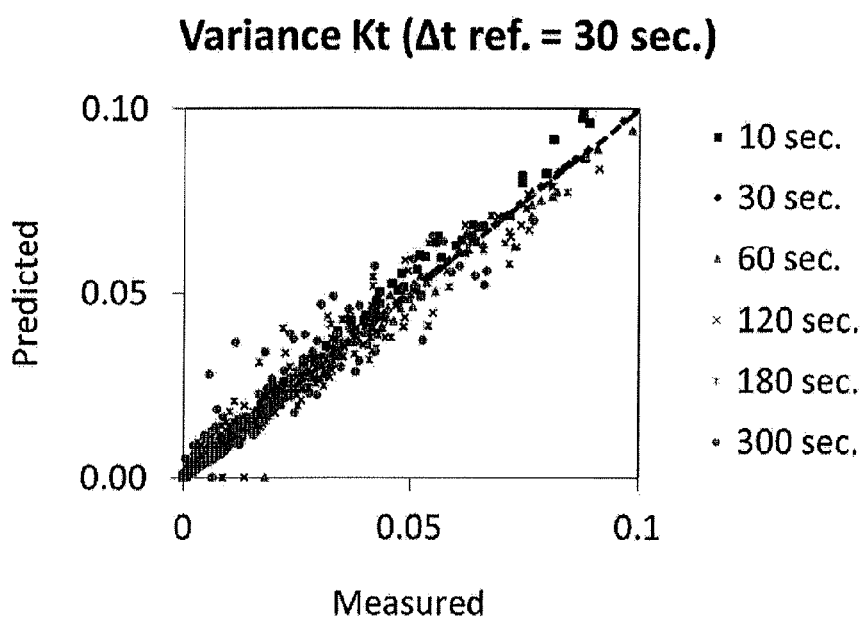
Figure 11C:
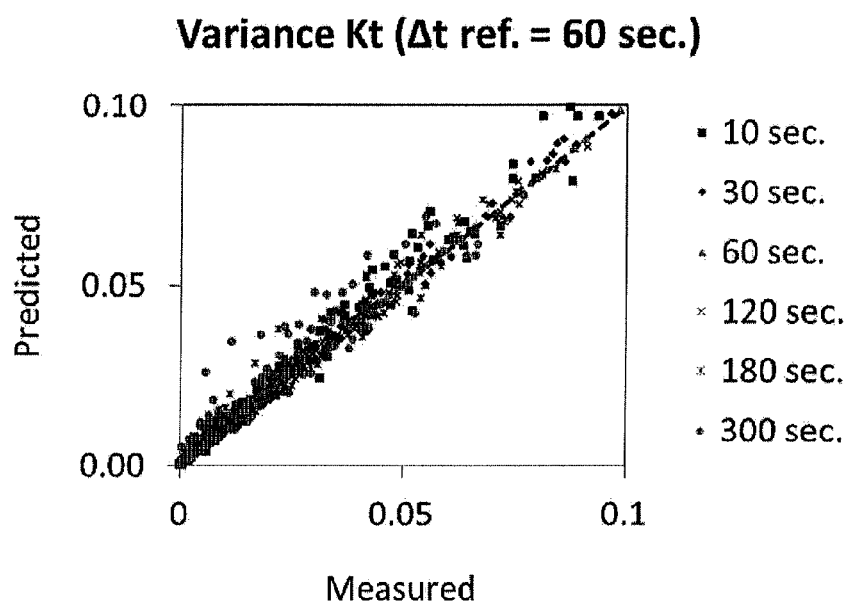
Figure 11D:
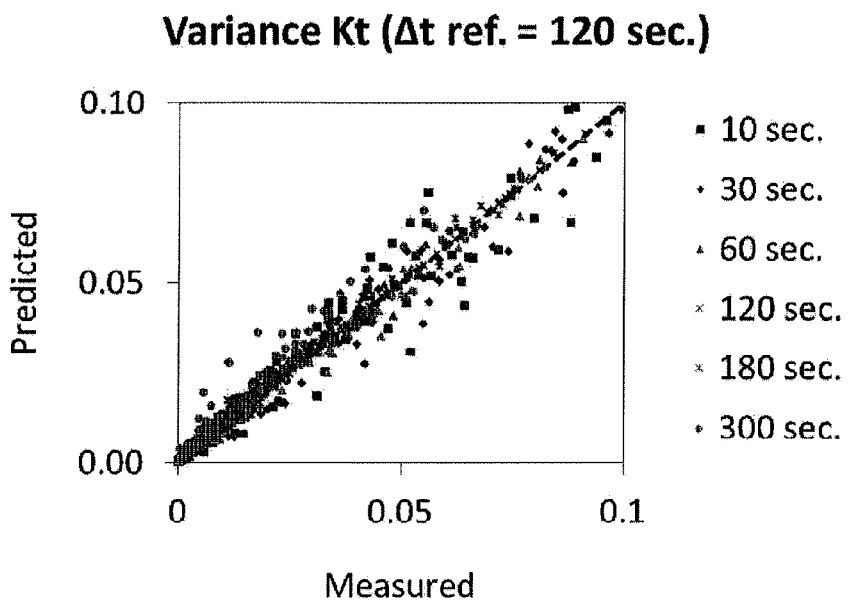
Figure 11E:
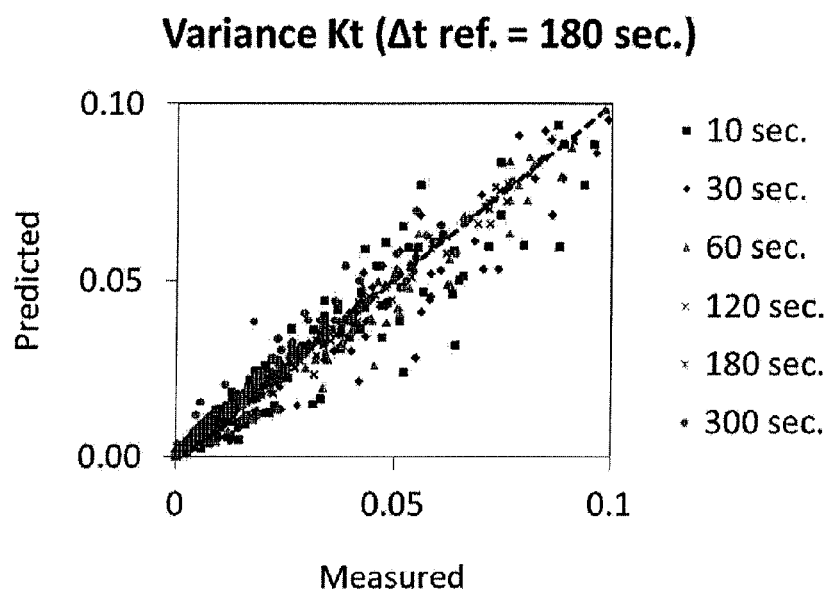
Figure 11F:
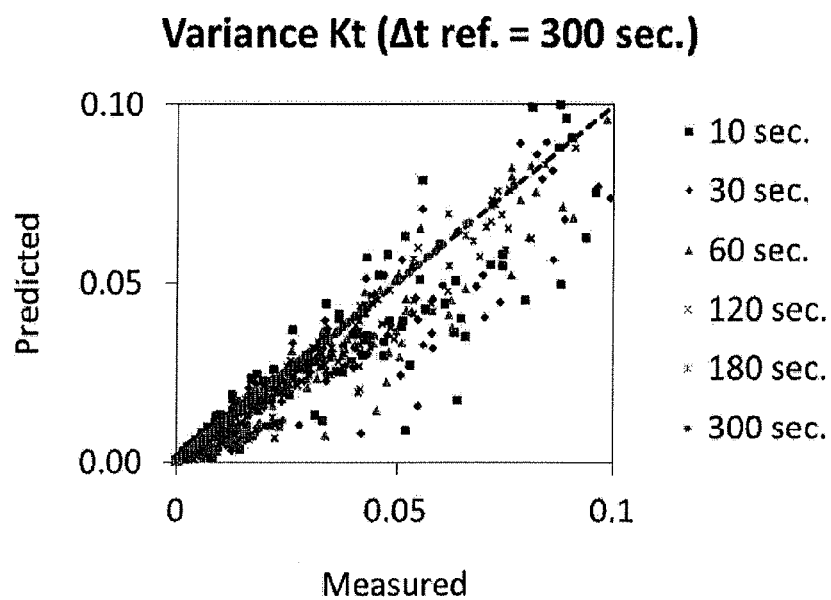
Figure 12A:
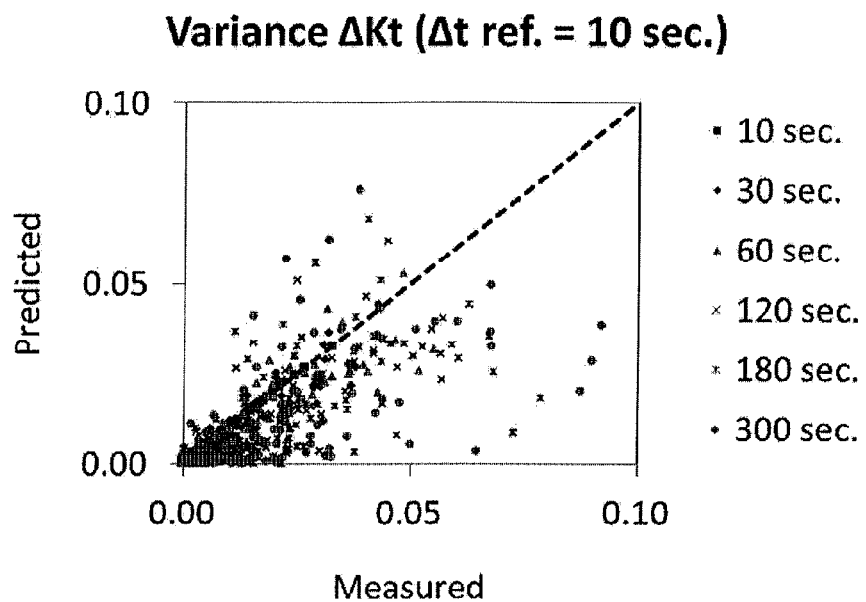
FIGS. 12A-12F are graphs depicting, by way of example, the predicted versus the measured variances of change in clearness indexes using different reference time intervals.
Figure 12B:
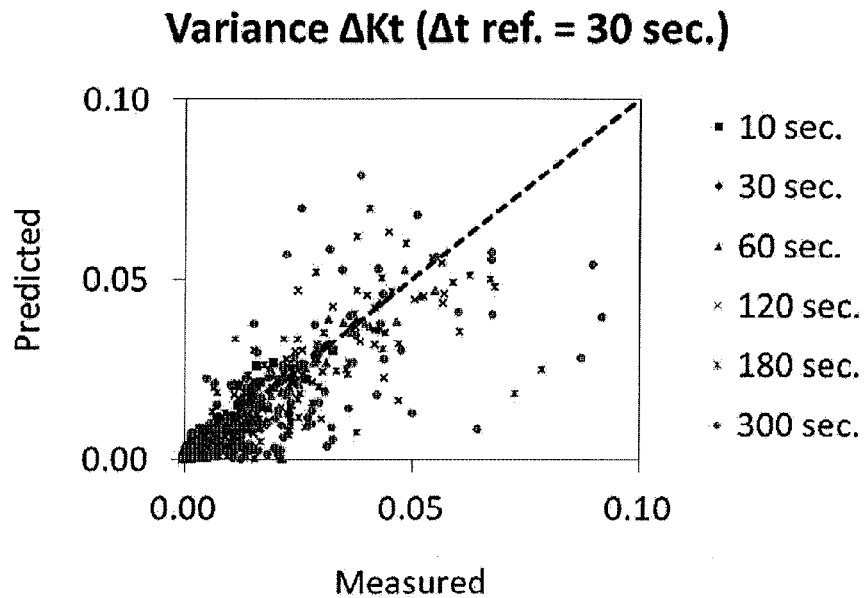
Figure 12C:
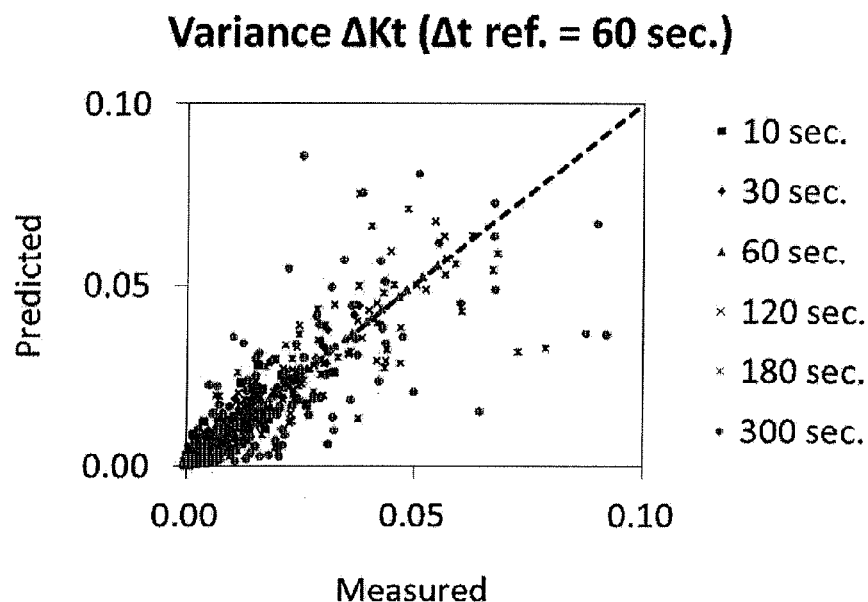
Figure 12D:
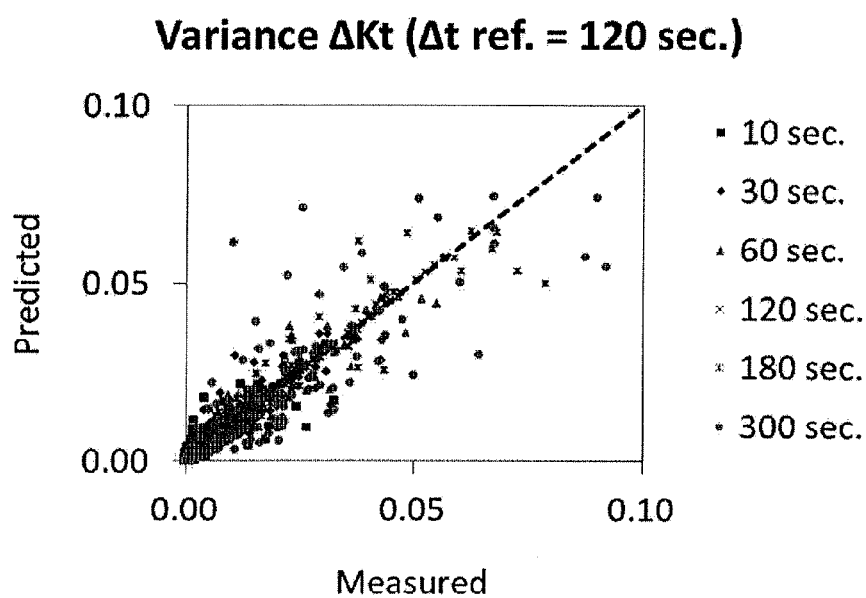
Figure 12E:
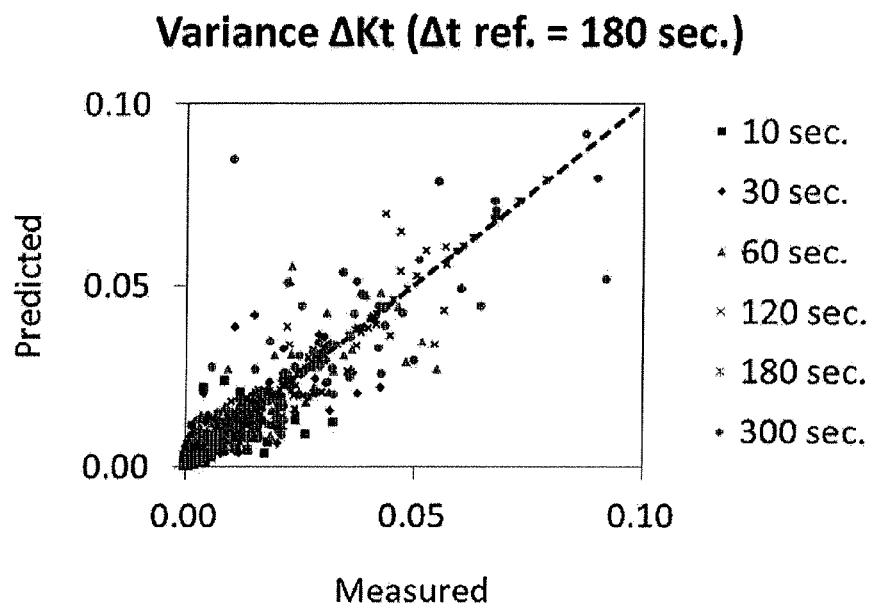
Figure 12F:
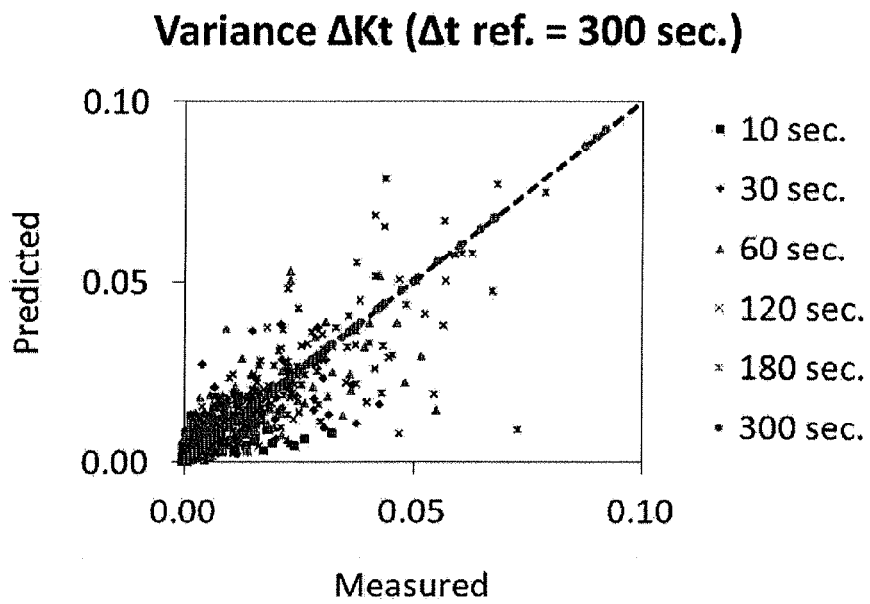

FIGS. 8A-8B are graphs depicting, by way of example, the adjustment factors plotted for time intervals from 10 seconds to 300 seconds. For example, if the variance is calculated at a 300-second time interval and the user desires results at a 10-second time interval, the adjustment for the variance clearness index would be 1.49

These empirical models represent a valuable means to rapidly calculate correlation coefficients and translate time interval with readily-available information, which avoids the use of computation-intensive calculations and high-speed streams of data from many point sources, as would otherwise be required.

Validation

Equations (44) and (45) were validated by calculating the correlation coefficients for every pair of locations in the Cordelia Junction network and the Napa network at half-hour time periods. The correlation coefficients for each time period were then weighted by the corresponding variance of that location and time period to determine weighted average correlation coefficient for each location pair. The weighting was performed as follows:

$$\overline{\rho^{Kt^i,Kt^j}} = \frac{\sum_{t=1}^{T} \sigma^2_{Kt-i,j_t} \rho^{Kt^i,Kt^j}_t}{\sum_{t=1}^{T} \sigma^2_{Kt-i,j_t}}, \text{ and}$$

$$\overline{\rho^{\Delta Kt^i, \Delta Kt^j}} = \frac{\sum_{t=1}^{T} \sigma^2_{\Delta Kt-i,j_t} \rho^{\Delta Kt^i, \Delta Kt^j}_t}{\sum_{t=1}^{T} \sigma^2_{\Delta Kt-i,j_t}}.$$

FIGS. 9A-9F are graphs depicting, by way of example, the measured and predicted weighted average correlation coefficients for each pair of locations versus distance. FIGS. 10A-10F are graphs depicting, by way of example, the same information as depicted in FIGS. 9A-9F versus temporal distance, based on the assumption that cloud speed was 6 meters per second. The upper line and dots appearing in close proximity to the upper line present the clearness index and the lower line and dots appearing in close proximity to the lower line present the change in clearness index for time intervals from 10 seconds to 5 minutes. The symbols are the measured results and the lines are the predicted results.

Several observations can be drawn based on the information provided by the FIGS. 9A-9F and 10A-10F. First, for a given time interval, the correlation coefficients for both the clearness index and the change in the clearness index follow an exponential decline pattern versus distance (and temporal distance). Second, the predicted results are a good representation of the measured results for both the correlation coefficients and the variances, even though the results are for two separate networks that vary in size by a factor of 100. Third, the change in the clearness index correlation coefficient converges to the clearness correlation coefficient as the time interval increases. This convergence is predicted based on the form of the empirical model because $\Delta$Clearness Power approaches one as $\Delta t$ becomes large.

Equation (46) and (47) were validated by calculating the average variance of the clearness index and the variance of the change in the clearness index across the 25 locations in each network for every half-hour time period. FIGS. 11A-11F are graphs depicting, by way of example, the predicted versus the measured variances of clearness indexes using different reference time intervals. FIGS. 12A-12F are graphs depicting, by way of example, the predicted versus the measured variances of change in clearness indexes using different reference time intervals. FIGS. 11A-11F and 12A-12F suggest that the predicted results are similar to the measured results.

Discussion

The point-to-point correlation coefficients calculated using the empirical forms described supra refer to the locations of specific photovoltaic power production sites. Importantly, note that the data used to calculate these coefficients was not obtained from time sequence measurements taken at the points themselves. Rather, the coefficients were calculated from fleet-level data (cloud speed), fixed fleet data (distances between points), and user-specified data (time interval).

The empirical relationships of the foregoing types of empirical relationships may be used to rapidly compute the coefficients that are then used in the fundamental mathematical relationships. The methodology does not require that these specific empirical models be used and improved models will become available in the future with additional data and analysis.

Example

This section provides a complete illustration of how to apply the methodology using data from the Napa network of 25 irradiance sensors on Nov. 21, 2010. In this example, the sensors served as proxies for an actual 1 kW photovoltaic fleet spread evenly over the geographical region as defined by the sensors. For comparison purposes, a direct measurement approach is used to determine the power of this fleet and the change in power, which is accomplished by adding up the 10-second output from each of the sensors and normalizing the output to a 1 kW system. FIGS. 13A-13F are graphs and a diagram depicting, by way of example, application of the methodology described herein to the Napa network.

Figure 13A:
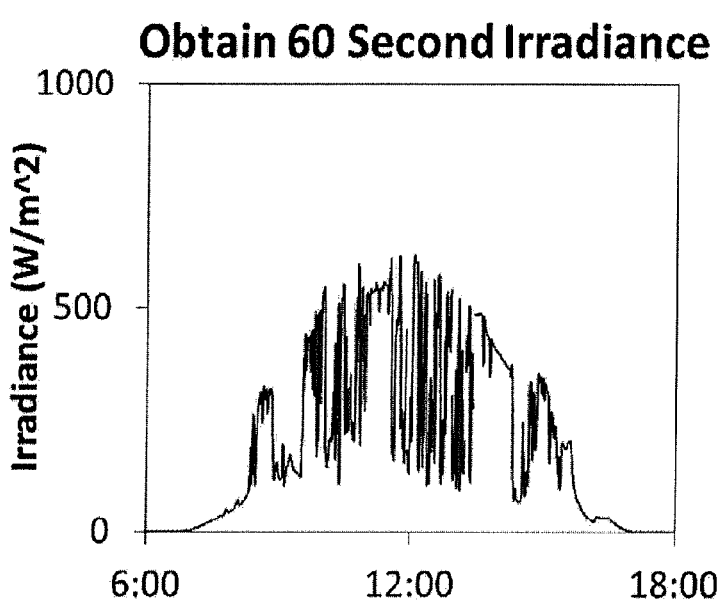
FIGS. 13A-13F are graphs and a diagram depicting, by way of example, application of the methodology described herein to the Napa network.
Figure 13B:
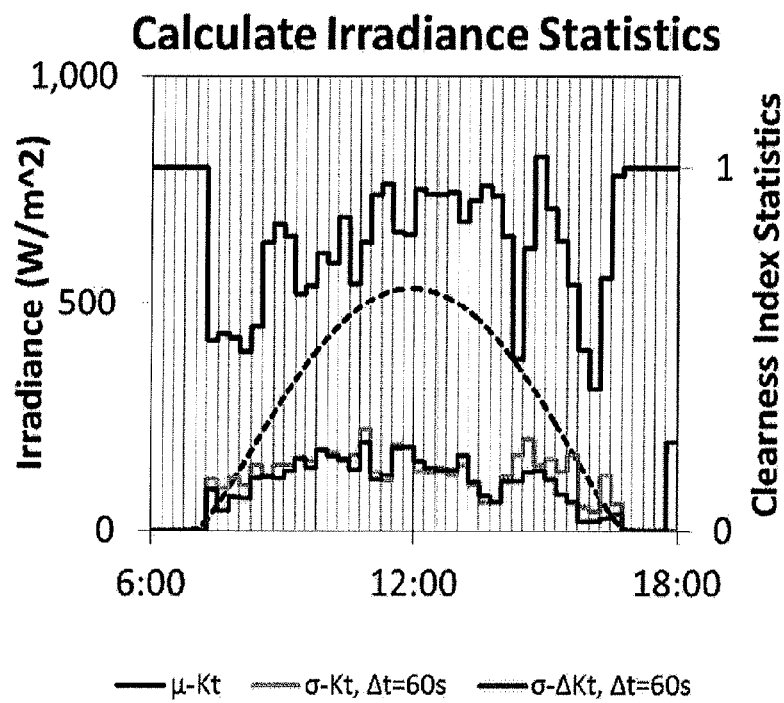
Figure 13C:
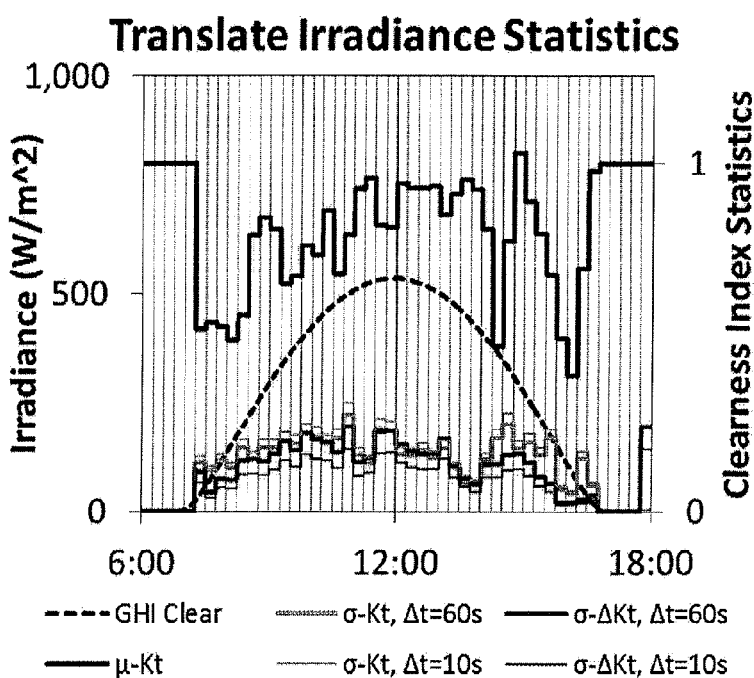
Figure 13D:
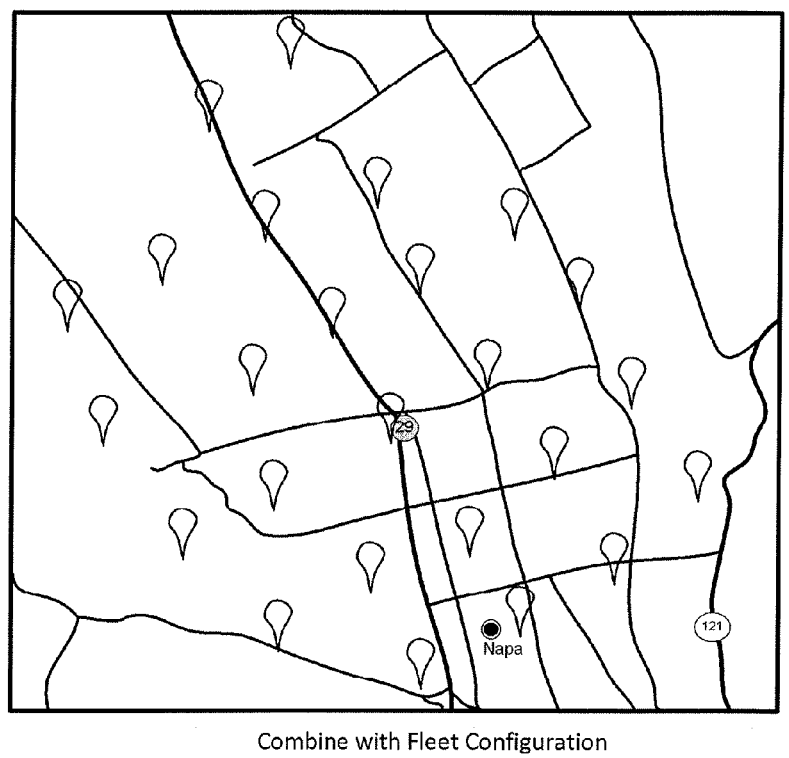
Figure 13E:
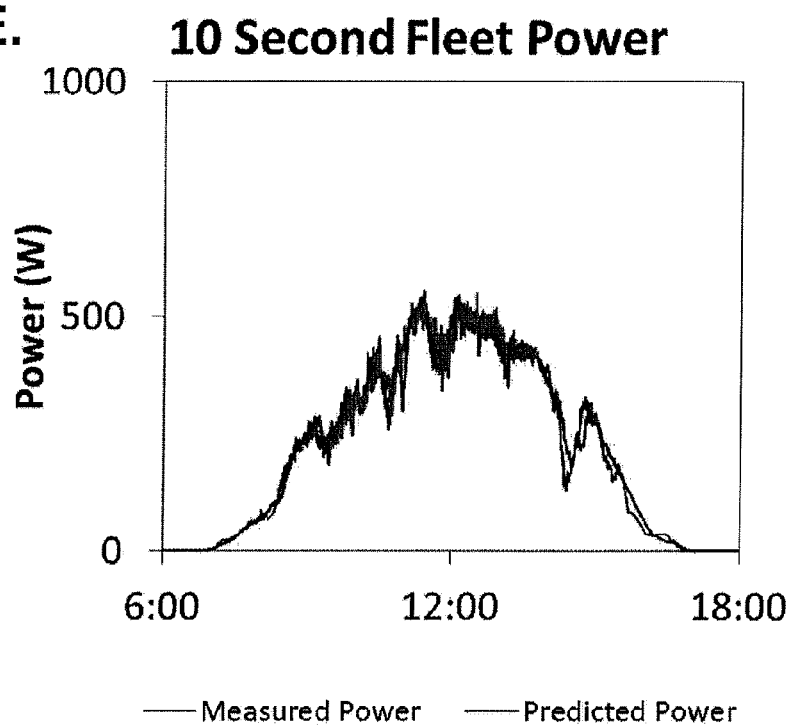
Figure 13F:
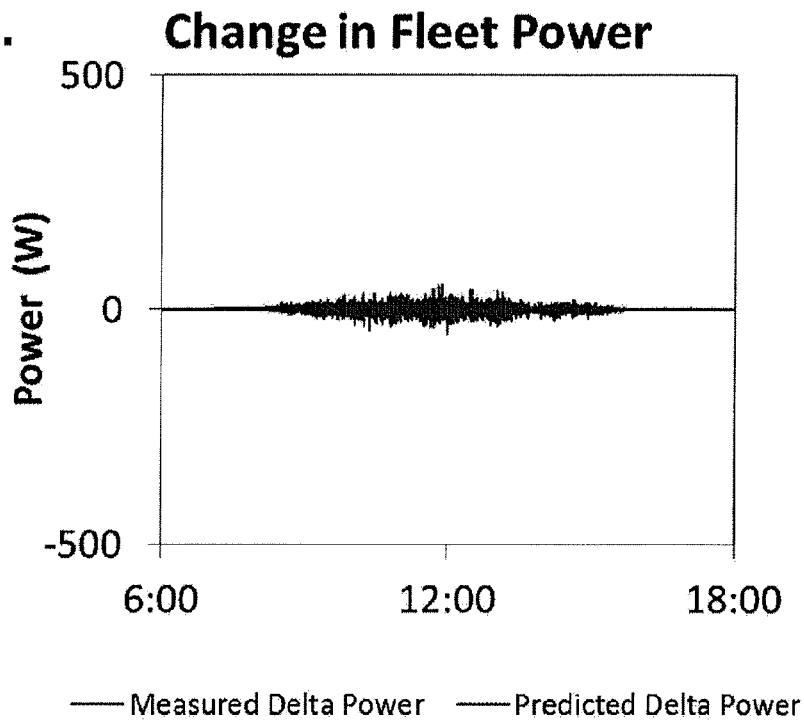

The predicted behavior of the hypothetical photovoltaic fleet was separately estimated using the steps of the methodology described supra. The irradiance data was measured using ground-based sensors, although other sources of data could be used, including from existing photovoltaic systems or satellite imagery. As shown in FIG. 13A, the data was collected on a day with highly variable clouds with one-minute global horizontal irradiance data collected at one of the 25 locations for the Napa network and specific 10-second measured power output represented by a blue line. This irradiance data was then converted from global horizontal irradiance to a clearness index. The mean clearness index, variance of clearness index, and variance of the change in clearness index were then calculated for every 15-minute period in the day. These calculations were performed for each of the 25 locations in the network. Satellite-based data or a statistically-significant subset of the ground measurement locations could have also served in place of the ground-based irradiance data. However, if the data had been collected from satellite regions, an additional translation from area statistics to average point statistics would have been required. The averaged irradiance statistics from Equations (1), (10), and (11) are shown in FIG. 13B, where standard deviation (a) is presented, instead of variance ($\sigma^2$) to plot each of these values in the same units.

In this example, the irradiance statistics need to be translated since the data were recorded at a time interval of 60 seconds, but the desired results are at a 10-second resolution. The translation was performed using Equations (46) and (47) and the result is presented in FIG. 13C.

The details of the photovoltaic fleet configuration were then obtained. The layout of the fleet is presented in FIG. 13D. The details include the location of the each photovoltaic system (latitude and longitude), photovoltaic system rating (1/25 kW), and system orientation (all are horizontal).

Equation (43), and its associated component equations, were used to generate the time series data for the photovoltaic fleet with the additional specification of the specific empirical models, as described in Equations (44) through (47). The resulting fleet power and change in power is presented represented by the red lines in FIGS. 12E and 12F.

Probability Density Function

The conversion from area statistics to point statistics relied upon two terms $A_{Kt}$ and $A_{\Delta Kt}$ to calculate $\sigma_{Kt}^2$ and $\sigma_{\Delta Kt}^2$, respectively. This section considers these terms in more detail. For simplicity, the methodology supra applies to both Kt and $\Delta$Kt, so this notation is dropped. Understand that the correlation coefficient $\rho^{i,j}$ could refer to either the correlation coefficient for clearness index or the correlation coefficient for the change in clearness index, depending upon context. Thus, the problem at hand is to evaluate the following relationship:

$$A = \left(\frac{1}{N^2}\right)\sum_{i=1}^{N}\sum_{j=1}^{N}\rho^{i,j} \qquad (48)$$

The computational effort required to calculate the correlation coefficient matrix can be substantial. For example, suppose that the one wants to evaluate variance of the sum of points within a 1 square kilometer satellite region by breaking the region into one million square meters (1,000 meters by 1,000 meters). The complete calculation of this matrix requires the examination of 1 trillion ($10^{12}$) location pair combinations.

Discrete Formulation

The calculation can be simplified using the observation that many of the terms in the correlation coefficient matrix are identical. For example, the covariance between any of the one million points and themselves is 1. This observation can be used to show that, in the case of a rectangular region that has dimension of H by W points (total of N) and the capacity is equal distributed across all parts of the region that:

$$\left(\frac{1}{N^2}\right)\sum_{i=1}^{N}\sum_{j=1}^{N}\rho^{i,j} = \left(\frac{1}{N^2}\right)\left[\sum_{i=0}^{H-1}\sum_{j=0}^{i}2^k[(H-i)(W-j)]\rho^d + \sum_{i=0}^{W-1}\sum_{j=0}^{i}2^k[(W-i)(H-j)]\rho^d\right] \qquad (49)$$

where:

$$k = \begin{array}{ll} -1, & \text{when } i = 0 \text{ and } j = 0 \\ 1, & \text{when } j = 0 \text{ or } j = i \\ 2, & \text{when } 0 < j < i \end{array}$$

When the region is a square, a further simplification can be made.

$$\left(\frac{1}{N^2}\right)\sum_{i=1}^{N}\sum_{j=1}^{N}\rho^{i,j} = \left(\frac{1}{N^2}\right)\left[\sum_{i=0}^{\sqrt{N}-1}\sum_{j=0}^{i}2^k(\sqrt{N}-i)(\sqrt{N}-j)\rho^d\right] \qquad (50)$$

where:

$$k = \begin{array}{ll} 0, & \text{when } i = 0 \text{ and } j = 0 \\ 2, & \text{when } j = 0 \text{ or } j = i \text{ and} \\ 3, & \text{when } 0 < j < i, \end{array}$$

$$d = (\sqrt{i^2 + j^2})\left(\frac{\sqrt{AREA}}{\sqrt{N}-1}\right).$$

The benefit of Equation (50) is that there are $$\frac{N - \sqrt{N}}{2}$$

rather than $N^2$ unique combinations that need to be evaluated. In the example above, rather than requiring one trillion possible combinations, the calculation is reduced to one-half million possible combinations.

Continuous Formulation

Even given this simplification, however, the problem is still computationally daunting, especially if the computation needs to be performed repeatedly in the time series. Therefore, the problem can be restated as a continuous formulation in which case a proposed correlation function may be used to simplify the calculation. The only variable that changes in the correlation coefficient between any of the location pairs is the distance between the two locations; all other variables are the same for a given calculation. As a result, Equation (50) can be interpreted as the combination of two factors: the probability density function for a given distance occurring and the correlation coefficient at the specific distance.

Figure 14:
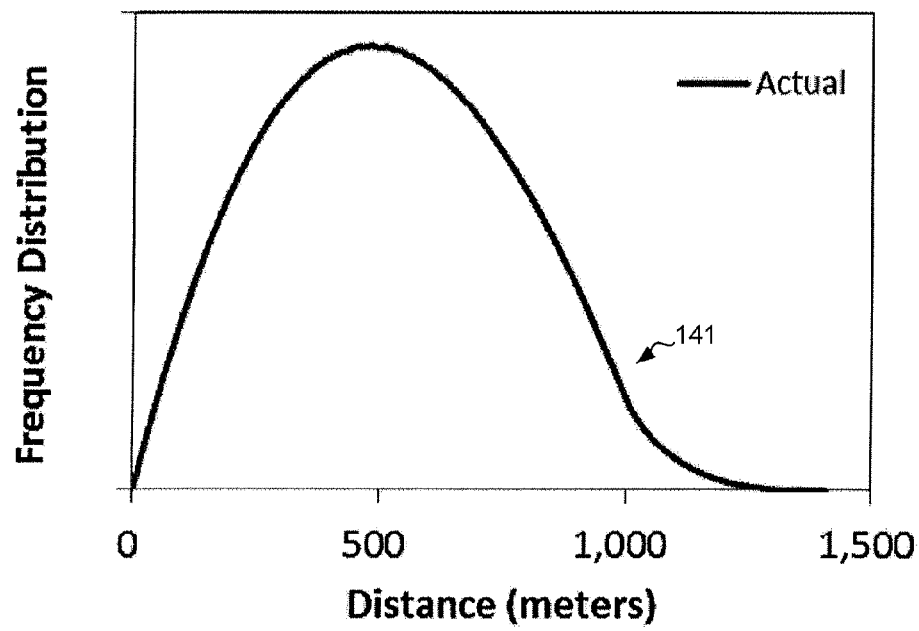
FIG. 14 is a graph depicting, by way of example, an actual probability distribution for a given distance between two pairs of locations, as calculated for a 1,000 meter×1,000 meter grid in one square meter increments.

Consider the probability density function. The actual probability of a given distance between two pairs occurring was calculated for a 1,000 meter×1,000 meter grid in one square meter increments. The evaluation of one trillion location pair combination possibilities was evaluated using Equation (48) and by eliminating the correlation coefficient from the equation. FIG. 14 is a graph depicting, by way of example, an actual probability distribution for a given distance between two pairs of locations, as calculated for a 1,000 meter×1,000 meter grid in one square meter increments.

The probability distribution suggests that a continuous approach can be taken, where the goal is to find the probability density function based on the distance, such that the integral of the probability density function times the correlation coefficient function equals:

$$A = \int f(D)\rho(d)dD \tag{51}$$

An analysis of the shape of the curve shown in FIG. 14 suggests that the distribution can be approximated through the use of two probability density functions. The first probability density function is a quadratic function that is valid between 0 and $\sqrt{Area}$.

$$f_{Quad} = \begin{cases} \left(\frac{6}{Area}\right)\left(D - \frac{D^2}{\sqrt{Area}}\right) & \text{for } 0 \leq D \leq \sqrt{Area} \\ 0 & \text{for } D > \sqrt{Area} \end{cases} \tag{52}$$

This function is a probability density function because integrating between 0 and equals 1 (i.e., $P[0 \leq D \leq \sqrt{Area}] = \int_0^{\sqrt{Area}} f_{Quad} dD = 1$).

The second function is a normal distribution with a mean of $\sqrt{Area}$ and standard deviation of $0.1\sqrt{Area}$.

$$f_{Norm} = \left(\frac{1}{0.1 * \sqrt{Area}}\right)\left(\frac{1}{\sqrt{2\pi}}\right) e^{-\left(\frac{1}{2}\right)\left(\frac{D - \sqrt{Area}}{0.1 * \sqrt{Area}}\right)^2} \tag{53}$$

Likewise, integrating across all values equals 1.

To construct the desired probability density function, take, for instance, 94 percent of the quadratic density function plus 6 of the normal density function.

$$f = 0.94 \int_0^{\sqrt{Area}} f_{Quad} dD + 0.06 \int_{-\infty}^{+\infty} f_{Norm} dD \tag{54}$$

Figure 15:
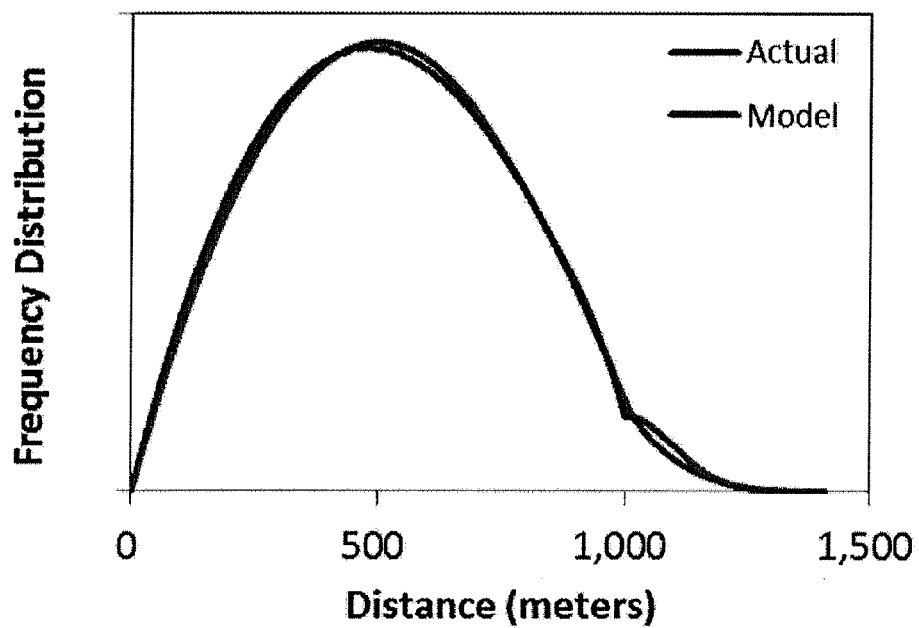
FIG. 15 is a graph depicting, by way of example, a matching of the resulting model to an actual distribution.

FIG. 15 is a graph depicting, by way of example, a matching of the resulting model to an actual distribution.

The result is that the correlation matrix of a square area with uniform point distribution as N gets large can be expressed as follows, first dropping the subscript on the variance since this equation will work for both Kt and ΔKt.

$$A \approx \left[0.94 \int_0^{\sqrt{Area}} f_{Quad} \rho(D) dD + 0.06 \int_{-\infty}^{+\infty} f_{Norm} \rho(D) dD\right] \tag{55}$$

where ρ(D) is a function that expresses the correlation coefficient as a function of distance (D).

Area to Point Conversion Using Exponential Correlation Coefficient

Equation (55) simplifies the problem of calculating the correlation coefficient and can be implemented numerically once the correlation coefficient function is known. This section demonstrates how a closed form solution can be provided, if the functional form of the correlation coefficient function is exponential.

Noting the empirical results as shown in the graph in FIGS. 9A-9F, an exponentially decaying function can be taken as a suitable form for the correlation coefficient function. Assume that the functional form of correlation coefficient function equals:

$$\rho(D) = e^{\frac{xD}{\sqrt{Area}}} \tag{56}$$

Let $Quad$ be the solution to $\int_0^{\sqrt{Area}} f_{Quad} \rho(D) dD$.

$$Quad = \int_0^{\sqrt{Area}} f_{Quad} \rho(D) dD = \tag{57}$$

$$\left(\frac{6}{Area}\right)\int_0^{\sqrt{Area}} \left(D - \frac{D^2}{\sqrt{Area}}\right)\left[e^{\frac{xD}{\sqrt{Area}}}\right] dD$$

Integrate to solve.

$$Quad = (6)\left[\left(\frac{x}{\sqrt{Area}} D - 1\right) e^{\frac{xD}{\sqrt{Area}}} - \right. \tag{58}$$

$$\left.\left(\left(\frac{x}{\sqrt{Area}}\right)^2 D^2 - 2\frac{x}{\sqrt{Area}} D + 2\right) e^{\frac{xD}{\sqrt{Area}}}\right]$$

Complete the result by evaluating at D equal to $\sqrt{Area}$ for the upper bound and 0 for the lower bound. The result is:

$$Quad = \left(\frac{6}{x^3}\right)[(x-2)(e^x + 1) + 4] \tag{59}$$

Next, consider the solution to $\int_{-\infty}^{+\infty} f_{Norm} \rho^{(D)dD}$, which will be called Norm.

$$Norm = \left(\frac{1}{\sigma}\right)\left(\frac{1}{\sqrt{2\pi}}\right)\int_{-\infty}^{+\infty} e^{-\left(\frac{1}{2}\right)\left(\frac{D-\mu}{\sigma}\right)^2} e^{\frac{xD}{\sqrt{Area}}} dD \tag{60}$$

Where $\mu=\sqrt{Area}$ and $\sigma=0.1\sqrt{Area}$. Simplifying:

$$Norm = \left[e^{\frac{x}{\sqrt{Area}}\left(\mu+\left(\frac{1}{2}\frac{x}{\sqrt{Area}}\right)\sigma^2\right)}\right] \quad (61)$$

$$\left(\frac{1}{\sigma}\right)\cdot\left(\frac{1}{\sqrt{2\pi}}\right)\int_{-\infty}^{+\infty} e^{-\left(\frac{1}{2}\right)\left[\frac{D-\left(\mu+\frac{x}{\sqrt{Area}}\sigma^2\right)}{\sigma}\right]^2} dD$$

Substitute $z = \dfrac{D-\left(\mu+\dfrac{x}{\sqrt{Area}}\sigma^2\right)}{\sigma}$ and $\sigma dz = dD$.

$$Norm = \left[e^{\frac{x}{\sqrt{Area}}\left(\mu+\left(\frac{1}{2}\frac{x}{\sqrt{Area}}\right)\sigma^2\right)}\right]\left(\frac{1}{\sqrt{2\pi}}\right)\int_{-\infty}^{+\infty} e^{-\left(\frac{1}{2}\right)z^2} dz \quad (62)$$

Integrate and solve.

$$Norm = e^{\frac{x}{\sqrt{Area}}\left(\mu+\left(\frac{1}{2}\frac{x}{\sqrt{Area}}\right)\sigma^2\right)} \quad (63)$$

Substitute the mean of $\sqrt{Area}$ and the standard deviation of $0.1\sqrt{Area}$ into Equation (63).

$$Norm = e^{x(1+0.005x)} \quad (64)$$

Substitute the solutions for Quad and Norm back into Equation (55). The result is the ratio of the area variance to the average point variance. This ratio was referred to as A (with the appropriate subscripts and superscripts) supra.

$$A = 0.94\left(\frac{6}{x^3}\right)[(x-2)(e^x+1)+4] + 0.06e^{x(1+0.005x)} \quad (65)$$

Example

This section illustrates how to calculate A for the clearness index for a satellite pixel that covers a geographical surface area of 1 km by 1 km (total area of 1,000,000 m²), using a 60-second time interval, and 6 meter per second cloud speed. Equation (56) required that the correlation coefficient be of the form $$e^{\frac{xD}{\sqrt{Area}}}.$$

The empirically derived result in Equation (44) can be rearranged and the appropriate substitutions made to show that the correlation coefficient of the clearness index equals $$\exp\left[\frac{(\ln\Delta t - 9.3)D}{1000\,CloudSpeed}\right].$$

Multiply the exponent by $$\frac{\sqrt{Area}}{\sqrt{Area}},$$

so that the correlation coefficient equals $$\exp\left\{\left[\frac{(\ln\Delta t - 9.3)\sqrt{Area}}{1000\,CloudSpeed}\right]\left[\frac{D}{\sqrt{Area}}\right]\right\}.$$

This expression is now in the correct form to apply Equation (65), where $$x = \frac{(\ln\Delta t - 9.3)\sqrt{Area}}{1000\,CloudSpeed}.$$

Figure 16:
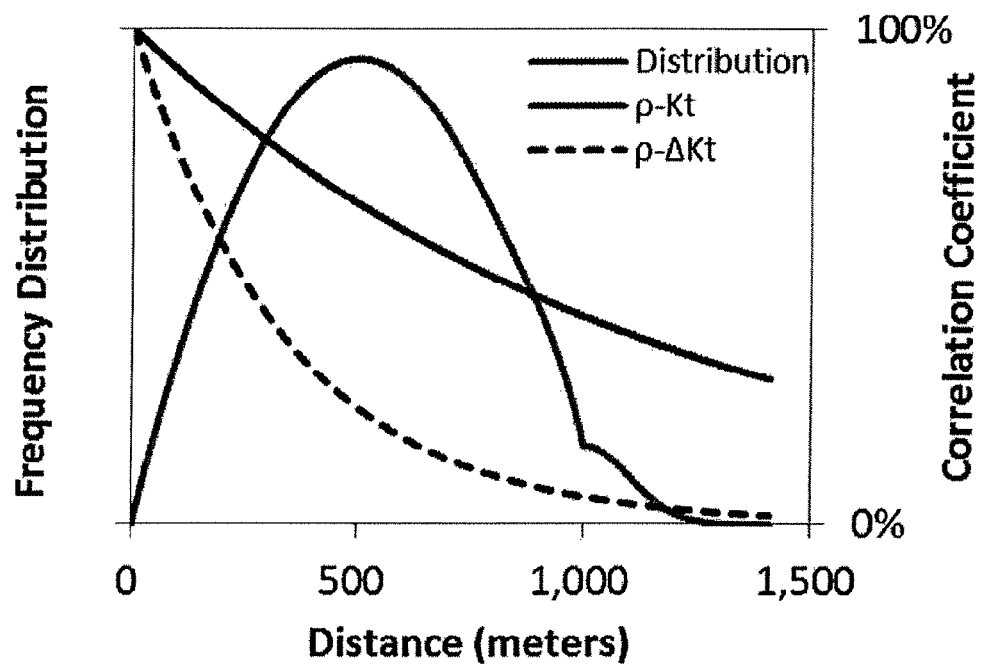
FIG. 16 is a graph depicting, by way of example, results generated by application of Equation (65).

Inserting the assumptions results in $$x = \frac{(\ln 60 - 9.3)\sqrt{1,000,000}}{1000 \times 6} = -0.86761,$$

which is applied to Equation (65). The result is that A equals 65 percent, that is, the variance of the clearness index of the satellite data collected over a 1 km² region corresponds to 65 percent of the variance when measured at a specific point. A similar approach can be used to show that the A equals 27 percent for the change in clearness index. FIG. 16 is a graph depicting, by way of example, results generated by application of Equation (65).

Time Lag Correlation Coefficient

This section presents an alternative approach to deriving the time lag correlation coefficient. The variance of the sum of the change in the clearness index equals:

$$\sigma^2_{\Sigma\Delta Kt} = VAR[\Sigma(Kt^{\Delta t} - Kt)] \quad (66)$$

where the summation is over N locations. This value and the corresponding subscripts have been excluded for purposes of notational simplicity.

Divide the summation into two parts and add several constants to the equation:

$$\sigma^2_{\Sigma\Delta Kt} = VAR\left[\sigma_{\Sigma Kt^{\Delta t}}\left(\frac{\Sigma Kt^{\Delta t}}{\sigma_{\Sigma Kt^{\Delta t}}}\right) - \sigma_{\Sigma Kt}\left(\frac{\Sigma Kt}{\sigma_{\Sigma Kt}}\right)\right] \quad (67)$$

Since $\sigma_{\Sigma Kt^{\Delta t}} \approx \sigma_{\Sigma Kt}$ (or $\sigma_{\Sigma Kt^{\Delta t}} = \sigma_{\Sigma Kt}$ if the first term in Kt and the last term in $Kt^{\Delta t}$ are the same):

$$\sigma^2_{\Sigma\Delta Kt} = \sigma^2_{\Sigma Kt} VAR\left[\frac{\Sigma Kt^{\Delta t}}{\sigma_{\Sigma Kt^{\Delta t}}} - \frac{\Sigma Kt}{\sigma_{\Sigma Kt}}\right] \quad (68)$$

The variance term can be expanded as follows:

$$\sigma^2_{\Sigma\Delta Kt} = \sigma^2_{\Sigma Kt}\left\{\frac{VAR[\Sigma Kt^{\Delta t}]}{\sigma^2_{\Sigma Kt^{\Delta t}}} + \frac{VAR[\Sigma Kt]}{\sigma^2_{\Sigma Kt}} - \frac{2COV[\Sigma Kt, \Sigma Kt^{\Delta t}]}{\sigma_{\Sigma Kt}\sigma_{\Sigma Kt^{\Delta t}}}\right\} \quad (69)$$

Since $COV[\Sigma Kt, \Sigma Kt^{\Delta t}] = \sigma_{\Sigma Kt}\sigma_{\Sigma Kt}\rho^{\Sigma Kt,\Sigma Kt}_{\Delta t}$, the first two terms equal one and the covariance term is replaced by the correlation coefficient.

$$\sigma^2_{\Sigma\Delta Kt} = \sigma^2_{\Sigma Kt}\left(1 - \rho^{\Sigma Kt,\Sigma Kt^{\Delta t}}\right) \quad (70)$$

This expression rearranges to:

$$\rho^{\Sigma Kt, \Sigma Kt^{\Delta t}} = 1 - \left(\frac{1}{2}\frac{\sigma^2_{\Delta Kt}}{\sigma^2_{Kt}}\right) \quad (71)$$

Assume that all photovoltaic plant ratings, orientations, and area adjustments equal to one, calculate statistics for the clearness alone using the equations described supra and then substitute. The result is:

$$\rho^{\Sigma Kt, \Sigma Kt^{\Delta t}} = 1 - \frac{P^{\Delta Kt}\sigma^2_{\Delta Kt}}{2P^{Kt}\sigma^2_{Kt}} \quad (72)$$

Relationship Between Time Lag Correlation Coefficient and Power/Change in Power Correlation Coefficient This section derives the relationship between the time lag correlation coefficient and the correlation between the series and the change in the series for a single location.

$$\rho^{P,\Delta P} = \frac{COV[P, \Delta P]}{\sqrt{\sigma^2_P \sigma^2_{\Delta P}}} = \frac{COV[P, P^{\Delta t} - P]}{\sqrt{\sigma^2_P \sigma^2_{\Delta P}}} = \frac{COV[P, P^{\Delta t}] - \sigma^2_P}{\sqrt{\sigma^2_P \sigma^2_{\Delta P}}}$$

Since $\sigma^2_{\Delta P} = VAR[P^{\Delta t} - P] = \sigma^2_P + \sigma^2_{P^{\Delta t}} - 2COV[P, P^{\Delta t}]$, and $COV[P, P^{\Delta t}] = \rho^{P,P^{\Delta t}}\sqrt{\sigma^2_P \sigma^2_{P^{\Delta t}}}$, then:

$$\rho^{P,\Delta P} = \frac{\rho^{P,P^{\Delta t}}\sqrt{\sigma^2_P \sigma^2_{P^{\Delta t}}} - \sigma^2_P}{\sqrt{\sigma^2_P(\sigma^2_P + \sigma^2_{P^{\Delta t}} - 2\rho^{P,P^{\Delta t}}\sqrt{\sigma^2_P \sigma^2_{P^{\Delta t}}})}}$$

Since $\sigma_P^2 \approx \sigma_{P^{\Delta t}}^2$, this expression can be further simplified. Then, square both expression and solve for the time lag correlation coefficient:

$$\rho^{P,P^{\Delta t}} = 1 - 2(\rho^{P,\Delta P})^2$$

Correlation Coefficients Between Two Regions

Assume that the two regions are squares of the same size, each side with N points, that is, a matrix with dimensions of $\sqrt{N}$ by $\sqrt{N}$ points, where $\sqrt{N}$ is an integer, but are separated by one or more regions. Thus:

$$\sum_{i=1}^{N}\sum_{j=1}^{N}\left(\frac{1}{N^2}\right)\rho^{i,j} = \left(\frac{1}{N^2}\right)\left[\sum_{i=0}^{\sqrt{N}-1}\sum_{j=1-\sqrt{N}}^{\sqrt{N}-1} k(\sqrt{N}-i)(\sqrt{N}-|j|)\rho^d\right] \quad (73)$$

where:

$$k = \begin{cases} 1, & \text{when } i = 0 \\ 2, & \text{when } i > 0 \end{cases}, \text{ and}$$

$$d = \left(\sqrt{i^2 + (j + M\sqrt{N})^2}\right)\left(\frac{\sqrt{Area}}{\sqrt{N}-1}\right),$$

and such that M equals the number of regions.

Figure 17:
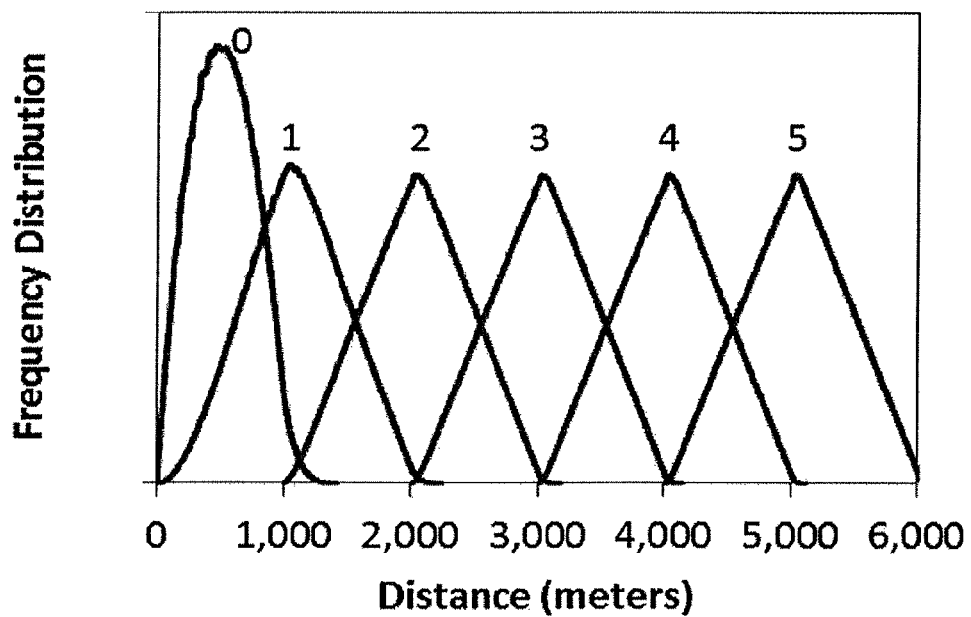
FIG. 17 is a graph depicting, by way of example, the probability density function when regions are spaced by zero to five regions.

FIG. 17 is a graph depicting, by way of example, the probability density function when regions are spaced by zero to five regions. FIG. 17 suggests that the probability density function can be estimated using the following distribution:

$$f = \begin{cases} 1 - \left(\frac{Spacing - D}{\sqrt{Area}}\right) & \text{for } Spacing - \sqrt{Area} \leq D \leq Spacing \\ 1 + \left(\frac{Spacing - D}{\sqrt{Area}}\right) & \text{for } Spacing \leq D \leq Spacing + \sqrt{Area} \\ 0 & \text{all else} \end{cases} \quad (74)$$

Figure 18:
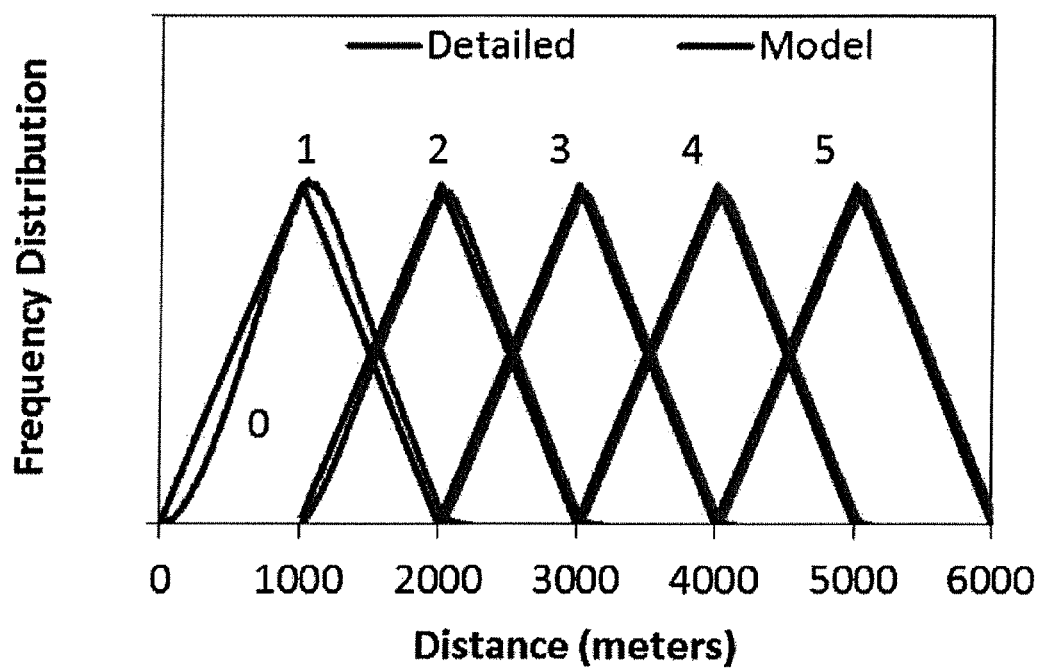
FIG. 18 is a graph depicting, by way of example, results by application of the model.

This function is a probability density function because the integration over all possible values equals zero. FIG. 18 is a graph depicting, by way of example, results by application of this model.

Inferring Photovoltaic System Configuration Specifications

Accurate power output forecasting through photovoltaic power prediction models, such as described supra, requires equally precise solar irradiance data and photovoltaic system configuration specifications. Solar irradiance data can be obtained from ground-based measurements, satellite imagery, numerical weather prediction models, as well as through various reliable third party sources, such as the Solar Anywhere service (http://www.SolarAnywhere.com), a Web-based service operated by Clean Power Research, L.L.C., Napa, Calif., that can provide satellite-derived solar irradiance data forecasted up to seven days ahead of time and archival solar irradiance data, dating back to Jan. 1, 1998, at time resolutions of as fast as one minute for historical data up to several hours forecasted and then transitioning to a one-hour time resolution up to seven days ahead of time.

On the other hand, obtaining accurate and reliable photovoltaic plant configuration specifications for individual photovoltaic systems can be a challenge, particularly when the photovoltaic systems are part of a geographically dispersed power generation fleet. Part of the concern arises due to an increasing number of grid-connected photovoltaic systems that are privately-owned residential and commercial systems, where they are neither controlled nor accessible by grid operators and power utilities, who require precise configuration specifications for planning and operations purposes or whether they are privately-owned utility-scale systems for which specifications are unavailable. Moreover, in some situations, the configuration specifications may be either incorrect, incomplete or simply not available.

Figure 19:
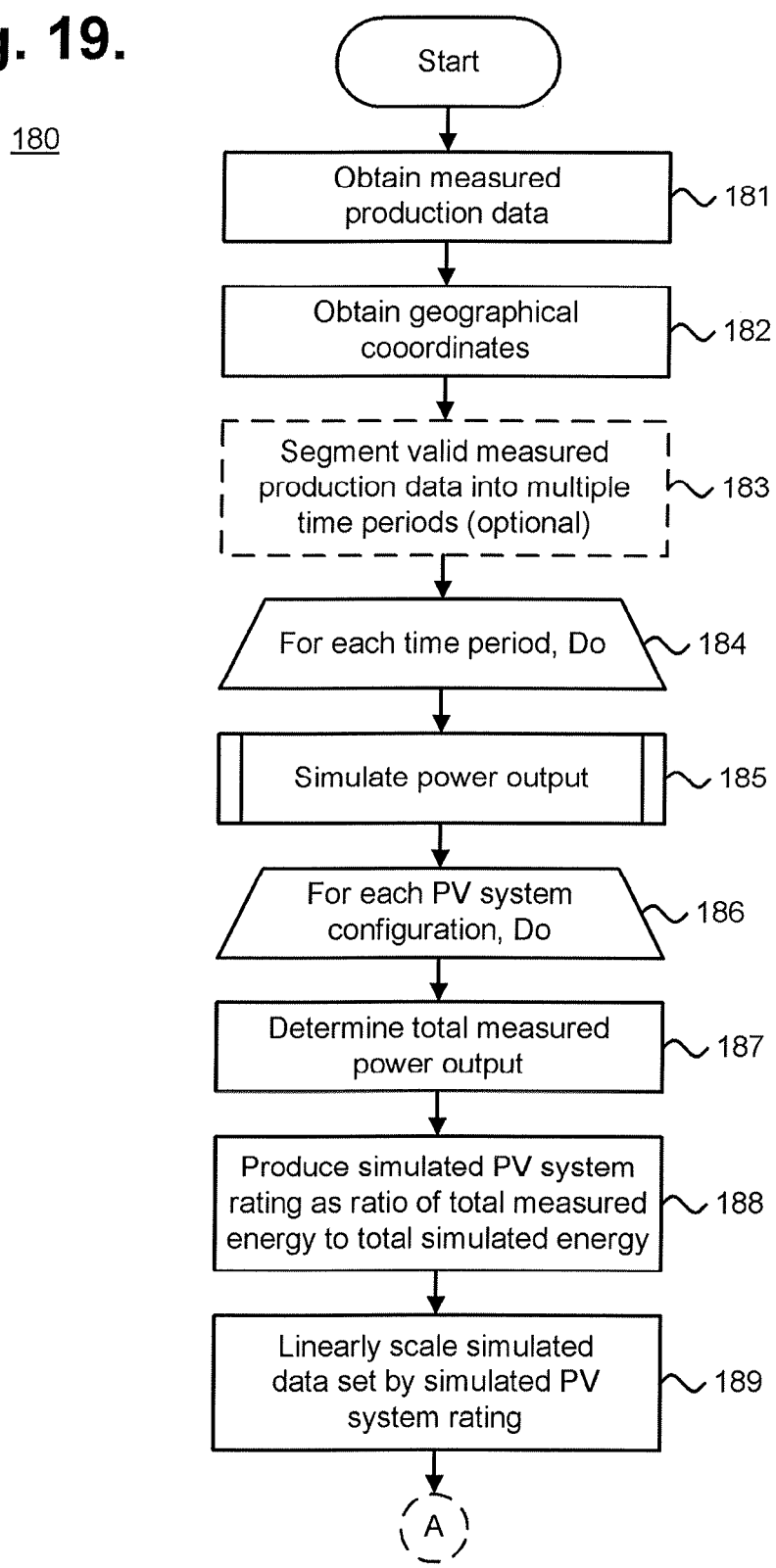
FIG. 19 is a flow diagram showing a computer-implemented method for inferring operational specifications of a photovoltaic power generation system in accordance with a further embodiment.

Photovoltaic plant configuration specifications can be accurately inferred through analysis of historical measurements of the photovoltaic plant's production data and measured historical irradiance data. FIG. 19 is a flow diagram showing a computer-implemented method 180 for inferring operational specifications of a photovoltaic power generation system 25 (shown in FIG. 2) in accordance with a further embodiment. Configuration data include the plant's power rating and electrical characteristics, including the effect of the efficiency of the modules, wiring, inverter, and other factors; and operational features, including tracking mode (fixed, single-axis tracking, dual-axis tracking), azimuth angle, tilt angle, row-to-row spacing, tracking rotation limit, and shading or other physical obstructions. Shading and physical obstructions can be evaluated by specifying obstructions as part of a configuration. For instance, an obstruction could be initially defined at an azimuth angle between 265° and 275° with a 10° elevation (tilt) angle. Additional configurations would vary the azimuth and elevation angles by fixed amounts, thereby exercising the range of possible obstruction scenarios. The method 180 can be implemented in software and execution of the software can be performed on a computer system 21, such as described supra with reference to FIG. 2, as a series of process or method modules or steps.

Configuration specifications can be inferred through evaluation of measured historical photovoltaic system production data and measured historical resource data. First, measured historical time-series photovoltaic system production data and geographical coordinates are respectively obtained for the photovoltaic power generation system 25 under evaluation (steps 181 and 182). Optionally, the production data can be segmented into multiple time periods for calculating the system's power rating during different times of the year (step 183). A set of photovoltaic plant configuration specifications is then inferred for each of the time periods, if applicable (steps 184-194), as follows. First, based on the measured historical production data, the output of a normalized 1 kW-AC photovoltaic system is simulated for the current time period for a wide range of hypothetical (or model) photovoltaic system configurations (step 186), as further described infra with reference to FIG. 21.

Following simulation, each of the hypothetical photovoltaic system configurations is evaluated (steps 186-191), as follows. The total measured energy produced over the selected time period (excluding any times with erroneous measured data, which are screened out during simulation, as explained infra) is determined (step 187). The ratio of the total measured energy over the total simulated energy is calculated (step 188), which produces a simulated photovoltaic system rating. However, system power ratings other than the ratio of measured-to-simulated energy could be used.

Assuming that a photovoltaic simulation model that scales linearly (or near-linearly, that is, approximately or substantially linear, such as described infra beginning with reference to Equation (12)) in photovoltaic system rating was used, each point in the simulated time series of power production data is then proportionately scaled up by the simulated photovoltaic system rating (step 189). Each of the points in the simulated and measured time series of power production data are matched up and the error between the measured and simulated power output is calculated (step 190) using standard statistical methodologies. For example, the relative mean absolute error (rMAE) can be used, such as described in Hoff et al., "Modeling PV Fleet Output Variability," Solar Energy 86, pp. 2177-2189 (2012) and Hoff et al, "Reporting of Irradiance Modeling Relative Prediction Errors," Progress in Photovoltaics: Res. Appl. doi: 10.1002/pip.2225 (2012) the disclosure of which is incorporated by reference. Other methodologies, including but not limited to root mean square error, to calculate the error between the measured and simulated data could also be used. Each hypothetical photovoltaic system configuration is similarly evaluated (step 191).

Once all of the configurations have been explored (steps 186-191), a variance threshold is established and the variance between the measured and simulated power outputs of all the configurations is taken (step 192) to ensure that invalid data has been excluded. The hypothetical photovoltaic system configuration, including, but not limited to, tracking mode (fixed, single-axis tracking, dual-axis tracking), azimuth angle, tilt angle, row-to-row spacing, tracking rotation limit, and shading configuration, that minimizes error is selected (step 193). The selected configuration represents the inferred photovoltaic system configuration specification for the photovoltaic power generation system 25 under evaluation for the current time period. Each time period is similarly evaluated (step 194). Once all of the time periods have been explored (steps 184-194), an inferred photovoltaic system configuration specification will have been selected for each time period. Ideally, the same configuration will have been selected across all of the time periods. However, in the event of different configurations having been selected, the configuration with the lowest overall error (step 193) can be picked. Alternatively, other tie-breaking configuration selection criteria could be applied, such as the system configuration corresponding to the most recent set of production data. In a further embodiment, mismatched configurations from each of the time periods may indicate a concern outside the scope of plant configuration evaluation. For instance, the capacity of a plant may have increased, thereby enabling the plant to generate more power that would be reflected by a simulation based on the hypothetical photovoltaic system configurations which were applied. (In this situation, the hypothetical photovoltaic system configurations would have to be modified beginning at the time period corresponding to the supposed capacity increase.) Still other tie-breaking configuration selection criteria are possible.

In addition, the range of hypothetical (or model) photovoltaic system configurations used in inferring the system's "optimal" configuration data, that is, a system configuration heuristically derived through evaluation of different permutations of configuration parameters, including power rating, electrical characteristics, and operational features, can be used to look at the affect of changing the configuration in view of historical measured performance. For instance, while the hypothetical configuration that minimizes error signifies the closest (statistical) fit between actual versus simulated power generation models, other hypothetical configurations may offer the potential to improve performance through changes to the plant's operational features, such as revising tracking mode (fixed, single-axis tracking, dual-axis tracking), azimuth, tilt, row-to-row spacing, tracking rotation limit, and shading configurations. Moreover, the accuracy or degree to which a system configuration is "optimal" can be improved further by increasing the degree by which each of the configuration parameters is varied. For instance, tilt angle can be permuted in one degree increments, rather than five degrees at a time. Still other ways of structuring or permuting the configuration parameters, as well as other uses of the hypothetical photovoltaic system configurations, are possible.

Figure 24:
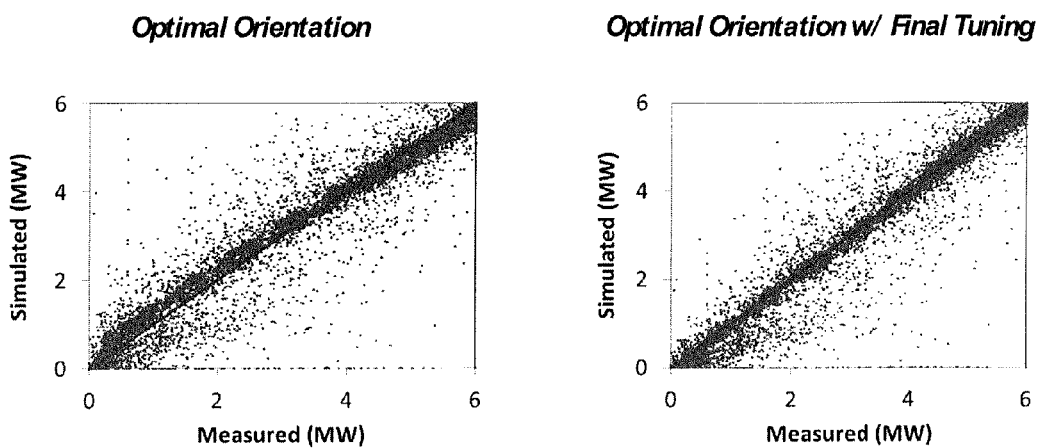
FIG. 24 are graphs depicting, by way of example, simulated versus measured power output for the optimal photovoltaic system configuration specifications as shown in FIG. 22.

Optionally, the selected photovoltaic system configuration can be tuned (step 195), as further described infra with reference to FIG. 24. The selected and, if applicable, tuned photovoltaic system configuration is then provided (step 196) as the inferred photovoltaic system configuration specifications, which can be used to correct, replace or, if configuration data is unavailable, stand-in for the system's specifications.

Power Output Simulation

Figure 20:
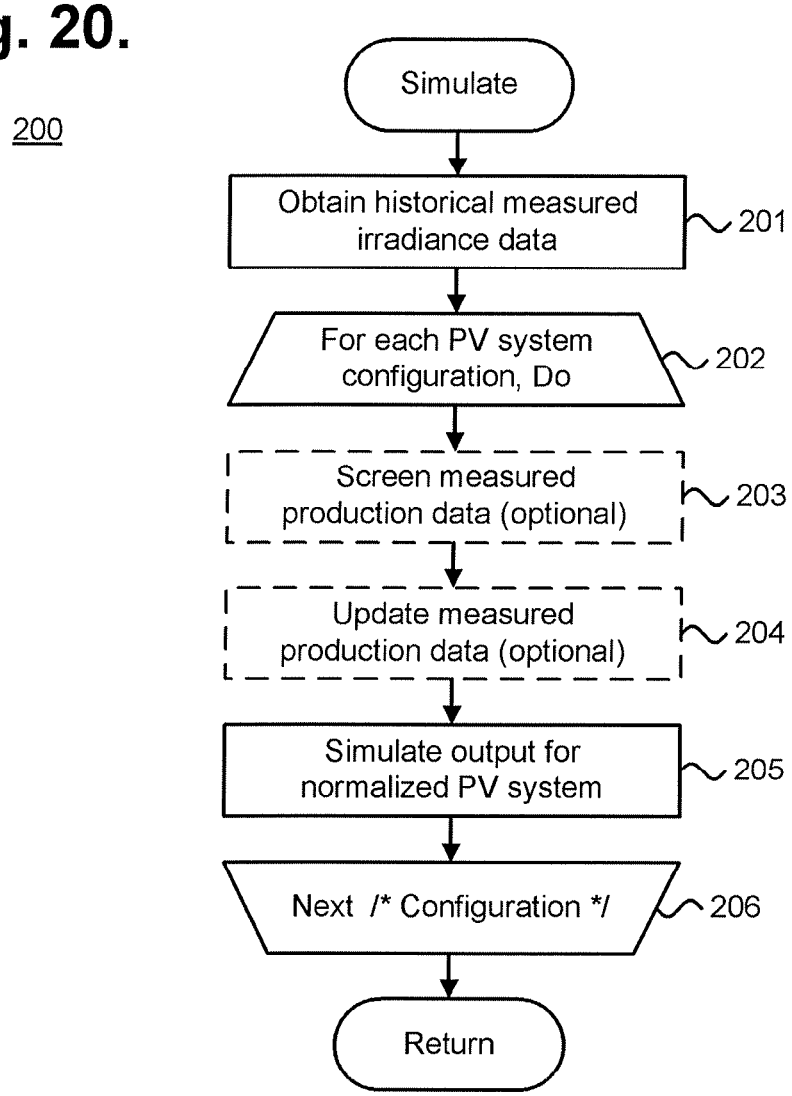
FIG. 20 is a flow diagram showing a routine 200 for simulating power output of a photovoltaic power generation system 25 for use in the method 180 of FIG. 19.

Photovoltaic power prediction models are typically used in forecasting power generation, but prediction models can also be used to simulate power output for hypothetical photovoltaic system configurations. The simulation results can then be evaluated against actual historical measured photovoltaic production data and statistically analyzed to identify the inferred (and most probable) photovoltaic system configuration specification. FIG. 20 is a flow diagram showing a routine 200 for simulating power output of a photovoltaic power generation system 25 for use in the method 180 of FIG. 19.

Power output is simulated for a wide range of hypothetical photovoltaic system configurations, which are defined to exercise the different types of photovoltaic system configurations possible. Each of the hypothetical configurations may vary based on power rating and electrical characteristics, including the effect of the efficiency of the solar modules, wiring, inverter, and related factors, and by their operational features, such as size and number of photovoltaic arrays, the use of fixed or tracking arrays, whether the arrays are tilted at different angles of elevation or are oriented along differing azimuthal angles, and the degree to which each system is covered by shade on a row-to-row basis or due to cloud cover or other physical obstructions. Still other configuration details are possible.

Initially, historical measured irradiance data for the current time period is obtained (step 201), such as described supra beginning with reference to FIG. 3. Preferably, the irradiance data includes is obtained from a solar resource data set that contains both historical and forecasted data, which allows further comparative analysis. Each of the hypothetical photovoltaic system configurations are evaluated (steps 202-206), as follows. Optionally, the measured irradiance data is screened (step 203) to eliminate data where observations are invalid either due to data recording issues or photovoltaic system performance issues power output. The production data, that is, measured power output, is correspondingly updated (step 204). Finally, power output is simulated based on the current system configuration and the measured irradiance data for the current time period (step 205), such as described supra beginning with reference to Equation (12). In one embodiment, a normalized 1 kW-AC photovoltaic system is simulated, which facilitates proportionately scaling the simulated power output based on the ratio (or function) of measured-to-simulated energy. A different approach may be required for photovoltaic simulation models that do not scale linearly (or near-linearly) with system rating. For instance, a non-linear (or non-near-linear) simulation model may need to be run multiple times until the system rating for the particular system configuration results in the same annual energy production as the measured data over the same time period. Still other approaches to scaling non-linear (or non-near-linear) simulation model results to actual measured energy output are possible. Each system configuration is similarly evaluated (step 206), after which power production simulation for the current time period is complete.

Example of Inferred Photovoltaic Plant Configuration Specifications

The derivation of a simulated photovoltaic system configuration can be illustrated with a simple example. FIG. 21 is a table showing, by way of example, simulated half-hour photovoltaic energy production for a 1 kW-AC photovoltaic system. Each column represents a different hypothetical photovoltaic system configuration. For instance, the first column represents a horizontal photovoltaic plant with a fixed array of solar panels set at a 180 degree azimuth with zero tilt. Each row represents the power produced at each half-hour period for a 1 kW-AC photovoltaic system, beginning on Jan. 1, 2012 (night time half-hour periods, when solar power production is zero, are omitted for clarity). The simulated energy production data covers the time period from Jan. 1, 2012 through Dec. 31, 2012, although only the first few hours of Jan. 1, 2012 are presented in FIG. 21. The latitude and longitude of the photovoltaic system were obtained and the Solar Anywhere service, cited supra, was used to obtain both historical and forecasted solar data and to simulate photovoltaic power output generation.

The simulated energy production can be compared to actual historical data. Here, in 2012, the photovoltaic plant produced 12,901,000 kWh in total measured energy, while the hypothetical photovoltaic system configuration represented in the first column had a simulated output of 1,960 kWh over the same time period (for a 1 kW-AC photovoltaic system). Assuming that a linearly-scalable (or near-linearly scalable) photovoltaic simulation model was used, the simulated output of 1,960 kWh implies that this particular system configuration would need a rating of 6,582 kW-AC to produce the same amount of energy, that is, 12,901,000 kWh, as the actual system. Thus, each half hour value can be multiplied by 6,582 to match simulated to actual power output.

Figure 22:
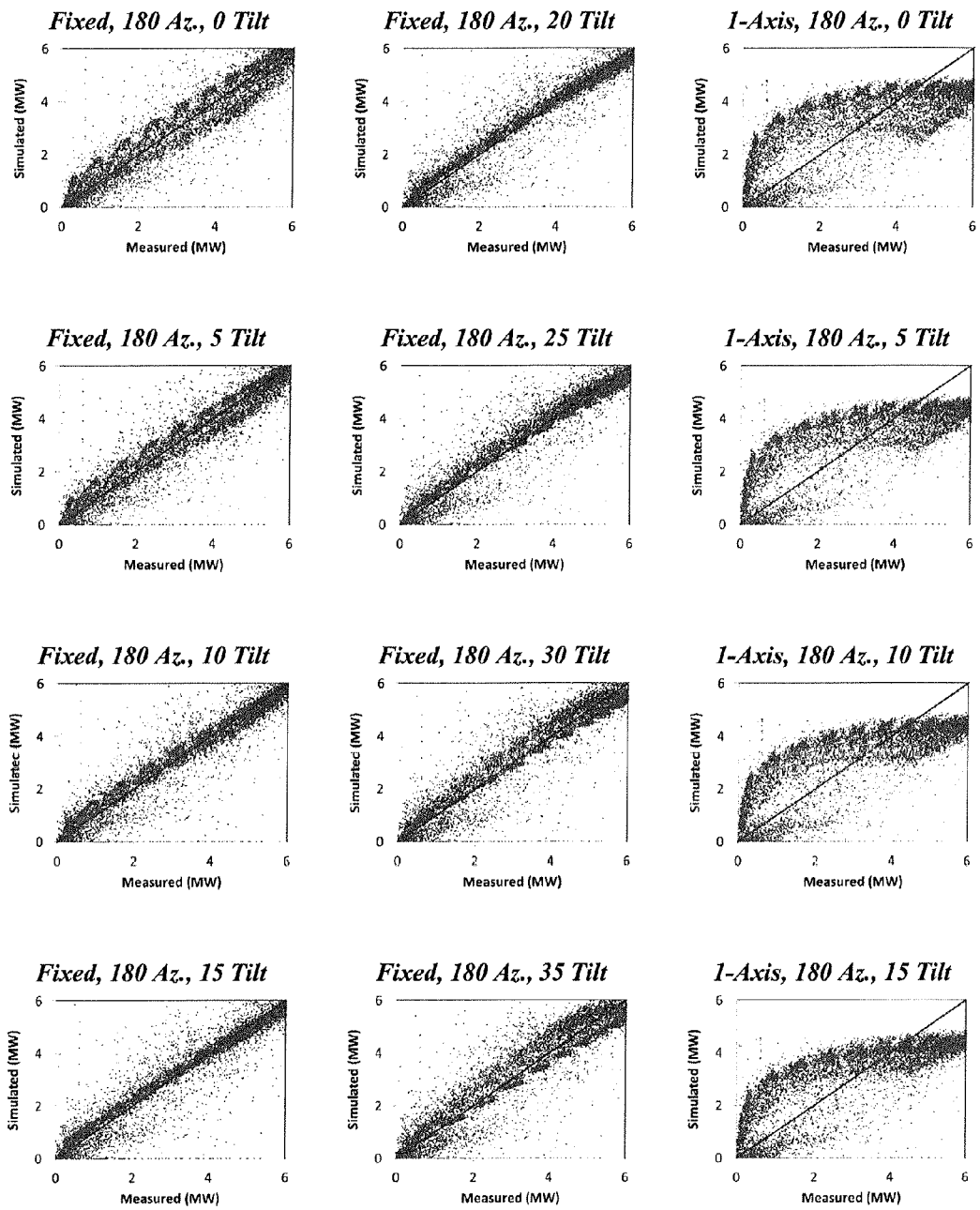
FIG. 22 are graphs depicting, by way of example, simulated versus measured power output for hypothetical photovoltaic system configuration specifications evaluated using the method 180 of FIG. 19.

The results can be visually presented. FIG. 22 are graphs depicting, by way of example, simulated versus measured power output 12 for hypothetical photovoltaic system configuration specifications evaluated using the method 180 of FIG. 19. Each of the graphs corresponds to photovoltaic power as produced under a different hypothetical photovoltaic system configuration, as shown in the columns of the table of FIG. 21. The x-axis of each graph represents measured power output in megawatts (MW). The y-axis of each graph represents simulated power output in megawatts (MW). Within each graph, the points present the half-hour simulated versus measured photovoltaic power data. Visually, the simulated versus measured power output data for the fixed system configuration with a 180 degree azimuth angle and 15 degree tilt shows the closest correlation.

Figure 23:
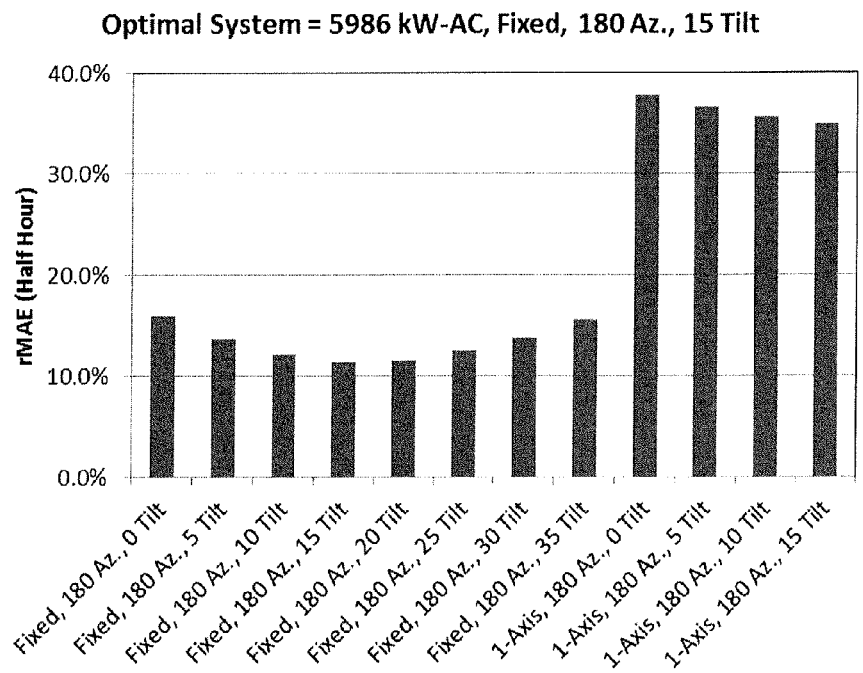
FIG. 23 is a graph depicting, by way of example, the relative mean absolute error between the measured and simulated power output for all system configurations as shown in FIG. 22.

Similarly, FIG. 23 is a graph depicting, by way of example, the rMAE between the measured and simulated power output for all system configurations as shown in FIG. 22. The x-axis represents the percentage of rMAE for half-hour intervals. The y-axis represents the different hypothetical photovoltaic system configurations. Again, the fixed system configuration with a 180 degree azimuth angle and 15 degree tilt reflects the lowest rMAE and accordingly provides an optimal system configuration.

Optimizing Photovoltaic System Configuration Specifications

Truly perfect weather data does not exist, as there will always be inaccuracies in weather data, whether the result of calibration or other errors or incorrect model translation. In addition, photovoltaic plant performance is ultimately unpredictable due to unforeseeable events and customer maintenance needs. For example, a power inverter outage is an unpredictable photovoltaic performance event, while photovoltaic panel washing after a long period of soiling is an example of an unpredictable customer maintenance event.

In a further embodiment, the power calibration model can be tuned to improve forecasts of power output of the photovoltaic plant based on the inferred (and optimal) photovoltaic plant configuration specification, such as described in commonly-assigned U.S. patent application, entitled "Computer-Implemented Method for Tuning Photovoltaic Power Generation Plant Forecasting," cited supra. Tuning helps to account for subtleties not incorporated into the selected photovoltaic simulation model, including any non-linear (or non-near-linear) issues in the power model. FIG. 24 are graphs depicting, by way of example, simulated versus measured power output for the optimal photovoltaic system configuration specifications as shown in FIG. 22. The graphs corresponds to photovoltaic power as produced under the optimal photovoltaic system configuration, that is, a fixed system configuration with a 180 degree azimuth angle and 15 degree tilt before (left graph) and after (right graph) tuning. The x-axis of each graph represents measured power output in megawatts (MW). The y-axis of each graph represents simulated power output in megawatts (MW).

Referring first to the "before" graph, the simulated power production data over-predicts power output during lower measured power conditions and under-predicts power output during high measured power conditions. Referring next to the "after" graph, tuning removes the uncertainty primarily due to irradiance data error and power conversion inaccuracies. As a result, the rMAE (not shown) is reduced from 11.4 percent to 9.1 percent while also eliminating much of the remaining bias.

While the invention has been particularly shown and described as referenced to the embodiments thereof, those skilled in the art will understand that the foregoing and other changes in form and detail may be made therein without departing from the spirit and scope.

What is claimed is:

1. A computer-implemented system for inferring operational specifications of a photovoltaic power generation system, comprising:
  a data storage comprising computer-readable data, comprising:
    historical power production data measured over an earlier time period for and a location of a photovoltaic power generation plant;
    historical measured irradiance data over the earlier time period; and
    a plurality of photovoltaic plant configurations that each comprise a power rating and operational features hypothesized for the plant;
  a computer comprising a processor and memory within which code for execution by the processor is stored, comprising:
    a simulation module configured to simulate power output production data for each of the photovoltaic plant configurations based on a normalized photovoltaic power generation plant using the historical measured irradiance data for the earlier time period;
    a system rating module configured to derive a simulated photovoltaic system rating as a function of the historical power production data and the simulated power output production data;
    a scaling module configured to scale the simulated power output production data by the simulated photovoltaic system rating over each point in the earlier time period; and
    an inference module configured to infer the plant's configuration from the photovoltaic plant configuration that exhibits a minimal error between the scaled simulated power output production data and the historical power production data.

2. A system according to claim 1, further comprising:
  a variance module configured to establish a variance threshold and to determine the variance between the scaled simulated power output production data and the historical power production data for each of the photovoltaic plant configurations,
  wherein the photovoltaic plant configuration corresponding to the scaled simulated power output production data exhibiting the least variance from the historical power production data also exhibits the minimal error.

3. A system according to claim 2, further comprising:
  an error evaluation module configured to evaluate the error between the scaled simulated power output production data and the historical power production data from which the variance is determined using an error measurement metric such as but not limited to relative mean absolute error or root mean square error.

4. A system according to claim 1, further comprising:
  the data storage further comprising further computer-readable data comprising a substantially linearly-scalable simulation model to simulate the power output production data for each of the photovoltaic plant configurations; and
  the system rating module further configured to select the simulated photovoltaic system rating as a ratio of the historical power production data to the simulated power output production data over the selected time period, and to proportionately scale the simulated power output production data by the selected ratio.

5. A system according to claim 1, further comprising:
  the data storage further comprising further computer-readable data comprising a non-linearly-scalable simulation model to simulate the power output production data for each of the photovoltaic plant configurations; and
  the system rating module further configured to repeat the simulation of the simulated power output production data until the simulated photovoltaic system rating results in substantially the same energy production as the historical power production data.

6. A system according to claim 1, further comprising:
  a time period module configured to divide the earlier time period into a plurality of individual time periods and segmenting the historical power production data according to the individual time periods;
  the simulation module further configured to simulate the power output production data for each of the photovoltaic plant configurations using only the historical measured irradiance data within each of the individual time periods; and
  the inference module further configured to infer the plant's configuration from the photovoltaic plant configuration that exhibits a minimal error between the scaled simulated power output production data and the historical power production data within each of the individual time periods.

7. A system according to claim 6, further comprising:
  a selection module configured to select the photovoltaic plant configuration that exhibits the least minimal error as the inferred plant configuration.

8. A system according to claim 1, further comprising:
  a tuning module configured to tune the scaled simulated power output production data and the historical power production data based on both predicted events and one or more of unforeseeable events and customer maintenance needs that can both affect the plant's power generation ability.

9. A system according to claim 1, further comprising:
  a screening module configured to screen the historical power production data by eliminating data where observations are invalid either due to data recording issues or photovoltaic system performance issues power output, and to remove the historical measured irradiance data corresponding to each point of screened historical power production data.

10. A system according to claim 1, further comprising:
  a definitions module configured to define each of the photovoltaic plant configurations based on one or more of power rating, electrical characteristics, size and number of photovoltaic arrays, use of fixed, single-axis tracking, or dual-axis tracking, tilted angles of elevation, orientation along azimuthal angles, row-to-row spacing, tracking rotation limit, shading due to cloud cover, and physical obstructions.

11. A computer-implemented method for inferring operational specifications of a photovoltaic power generation system, comprising the steps of:
    obtaining historical power production data measured over an earlier time period for and a location of a photovoltaic power generation plant;
    obtaining historical measured irradiance data over the earlier time period;
    defining a plurality of photovoltaic plant configurations that each comprise a power rating and operational features hypothesized for the plant;
    simulating power output production data for each of the photovoltaic plant configurations based on a normalized photovoltaic power generation plant using the historical measured irradiance data for the earlier time period;
    deriving a simulated photovoltaic system rating as a function of the historical power production data and the simulated power output production data;
    scaling the simulated power output production data by the simulated photovoltaic system rating over each point in the earlier time period;
    inferring the plant's configuration from the photovoltaic plant configuration that exhibits a minimal error between the scaled simulated power output production data and the historical power production data,
    wherein the steps are performed on a suitably-programmed computer.

12. A method according to claim 11, further comprising the step of:
    establishing a variance threshold and determining the variance between the scaled simulated power output production data and the historical power production data for each of the photovoltaic plant configurations,
    wherein the photovoltaic plant configuration corresponding to the scaled simulated power output production data exhibiting the least variance from the historical power production data also exhibits the minimal error.

13. A method according to claim 12, further comprising the step of:
    evaluating the error between the scaled simulated power output production data and the historical power production data from which the variance is determined using an error measurement metric such as but not limited to relative mean absolute error or root mean square error.

14. A method according to claim 11, further comprising the steps of:
    selecting a substantially linearly-scalable simulation model to simulate the power output production data for each of the photovoltaic plant configurations;
    selecting the simulated photovoltaic system rating as a ratio of the historical power production data to the simulated power output production data over the selected time period; and
    proportionately scaling the simulated power output production data by the selected ratio.

15. A method according to claim 11, further comprising the steps of:
    selecting a non-linearly-scalable simulation model to simulate the power output production data for each of the photovoltaic plant configurations; and
    repeating the simulation of the simulated power output production data until the simulated photovoltaic system rating results in substantially the same energy production as the historical power production data.

16. A method according to claim 11, further comprising the steps of:
    dividing the earlier time period into a plurality of individual time periods and segmenting the historical power production data according to the individual time periods;
    simulating the power output production data for each of the photovoltaic plant configurations using only the historical measured irradiance data within each of the individual time periods; and
    inferring the plant's configuration from the photovoltaic plant configuration that exhibits a minimal error between the scaled simulated power output production data and the historical power production data within each of the individual time periods.

17. A method according to claim 16, further comprising the step of:
    selecting the photovoltaic plant configuration that exhibits the least minimal error as the inferred plant configuration.

18. A method according to claim 11, further comprising the steps of:
    tuning the scaled simulated power output production data and the historical power production data based on both predicted events and one or more of unforeseeable events and customer maintenance needs that can both affect the plant's power generation ability.

19. A method according to claim 11, further comprising the steps of:
    screening the historical power production data by eliminating data where observations are invalid either due to data recording issues or photovoltaic system performance issues power output; and
    removing the historical measured irradiance data corresponding to each point of screened historical power production data.

20. A method according to claim 11, further comprising the steps of:
    defining each of the photovoltaic plant configurations based on one or more of power rating, electrical characteristics, size and number of photovoltaic arrays, use of fixed, single-axis tracking, or dual-axis tracking, tilted angles of elevation, orientation along azimuthal angles, row-to-row spacing, tracking rotation limit, shading due to cloud cover, and physical obstructions.

21. A non-transitory computer readable storage medium storing code for executing on a computer system to perform the method according to claim 11.

* * * * *